US007474558B2

(12) United States Patent  
Liao et al.

(10) Patent No.: US 7,474,558 B2
(45) Date of Patent: *Jan. 6, 2009

(54) GATED DIODE NONVOLATILE MEMORY CELL ARRAY

(75) Inventors: Yi Ying Liao, Sijhih (TW); Wen Jer Tsai, Hualien (TW); Chih Chieh Yeh, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/865,616

(22) Filed: Oct. 1, 2007

(65) Prior Publication Data

US 2008/0019172 A1   Jan. 24, 2008

Related U.S. Application Data

(63) Continuation of application No. 11/298,912, filed on Dec. 9, 2005, now Pat. No. 7,283,389.

(51) Int. Cl.
    *G11C 11/36* (2006.01)
(52) U.S. Cl. .............. 365/175; 365/185.01; 365/185.18; 257/104
(58) Field of Classification Search ................. 365/175, 365/185.01, 185.18, 185.21, 185.33, 183; 257/104–105, 315, 324, 411
See application file for complete search history.

(56) References Cited

U.S. PATENT DOCUMENTS

| 4,939,690 | A | | 7/1990 | Momodomi et al. |
| 5,365,083 | A | | 11/1994 | Tada et al. |
| 5,471,087 | A | * | 11/1995 | Buerger, Jr. ................. 257/532 |
| 5,483,484 | A | | 1/1996 | Endoh et al. |
| 5,535,153 | A | * | 7/1996 | Saeki .......................... 365/72 |
| 5,617,357 | A | | 4/1997 | Haddad et al. |
| 5,753,950 | A | | 5/1998 | Kojima et al. |
| 5,768,192 | A | | 6/1998 | Eitan et al. |
| 5,814,853 | A | | 9/1998 | Chen |
| 5,912,840 | A | | 6/1999 | Gonzalez et al. |
| 6,008,525 | A | | 12/1999 | Barron et al. |
| 6,011,725 | A | | 1/2000 | Eitan et al. |
| 6,160,286 | A | | 12/2000 | Chi et al. |
| 6,351,411 | B2 | | 2/2002 | Forbes et al. |
| 6,436,769 | B1 | | 8/2002 | Kanamori et al. |
| 6,510,082 | B1 | | 1/2003 | Le et al. |
| 6,614,686 | B1 | | 9/2003 | Kawamura et al. |
| 6,631,085 | B2 | | 10/2003 | Kleveland et al. |
| 6,639,836 | B1 | | 10/2003 | Hung et al. |

(Continued)

OTHER PUBLICATIONS

Yeh, C.C., et al., "Phines: A Novel Low Power Program/Erase, Small Pitch, 2-Bit per Cell Flash Memory," Electron Devices Meeting, 2002. IEDM '02. Digest. International , Dec. 8-11, 2002, pp. 931-934. cited by other.

*Primary Examiner*—David Lam
(74) *Attorney, Agent, or Firm*—Kenta Suzue; Haynes Beffel & Wolfeld LLP

(57) ABSTRACT

A gated diode nonvolatile memory cell with a charge storage structure includes a diode structure with an additional gate terminal. Example embodiments include the individual memory cell, an array of such memory cells, methods of operating the memory cell or array of memory cells, and methods of manufacturing the same.

16 Claims, 26 Drawing Sheets

U.S. PATENT DOCUMENTS

| | | |
|---|---|---|
| 6,646,914 B1 | 11/2003 | Haddad et al. |
| 6,657,894 B2 | 12/2003 | Yeh et al. |
| 6,670,240 B2 | 12/2003 | Ogura et al. |
| 6,690,601 B2 | 2/2004 | Yeh et al. |
| 6,771,543 B2 | 8/2004 | Wong et al. |
| 6,808,986 B2 | 10/2004 | Rao et al. |
| 6,826,080 B2 | 11/2004 | Park et al. |
| 6,862,216 B1 | 3/2005 | Hopper et al. |
| 6,873,004 B1 | 3/2005 | Han et al. |
| 6,996,011 B2 | 2/2006 | Yeh et al. |
| 7,072,219 B1 | 7/2006 | Yeh et al. |
| 7,209,384 B1 * | 4/2007 | Kim .................. 365/175 |
| 7,269,062 B2 * | 9/2007 | Liao et al. ............ 365/175 |
| 7,283,389 B2 * | 10/2007 | Liao et al. ............ 365/175 |
| 2002/0167844 A1 | 11/2002 | Han et al. |
| 2003/0032243 A1 | 2/2003 | Ogura et al. |

* cited by examiner

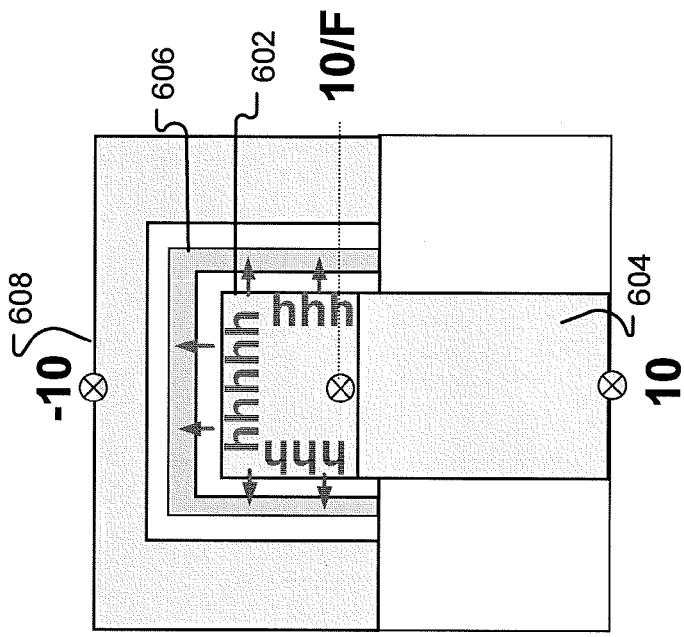
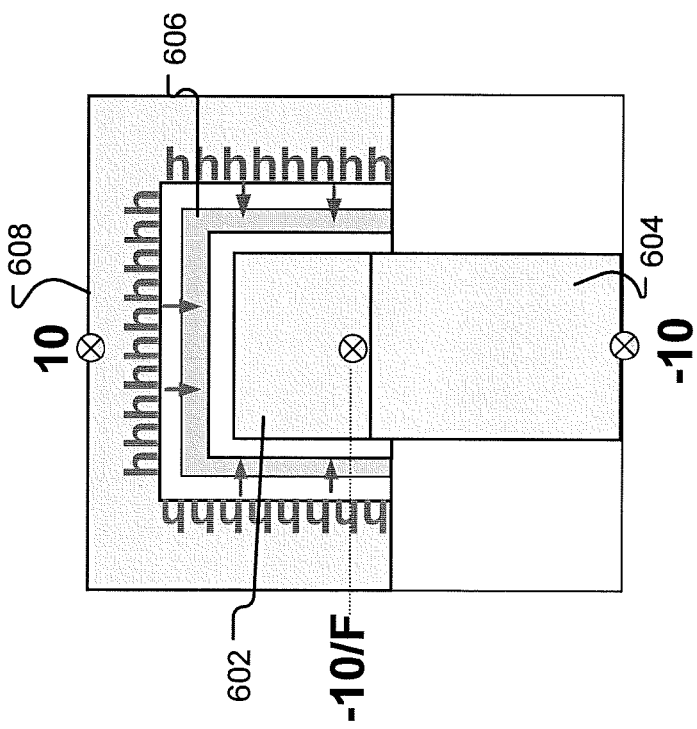
Fig. 8B
Fig. 8A

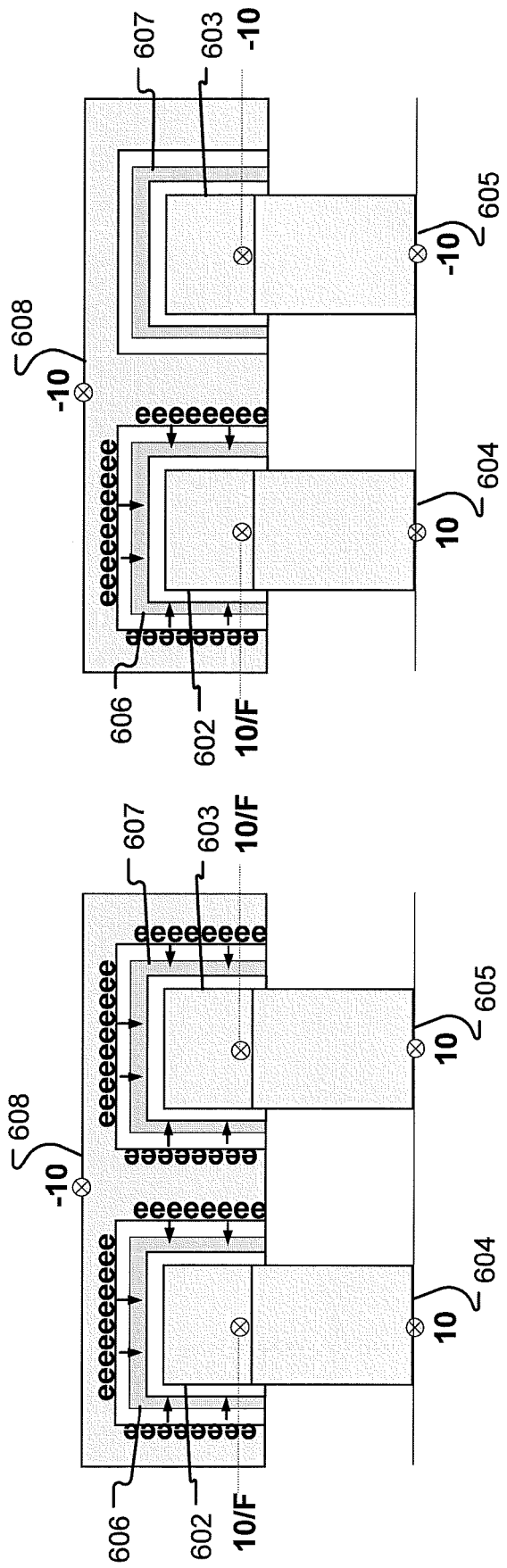

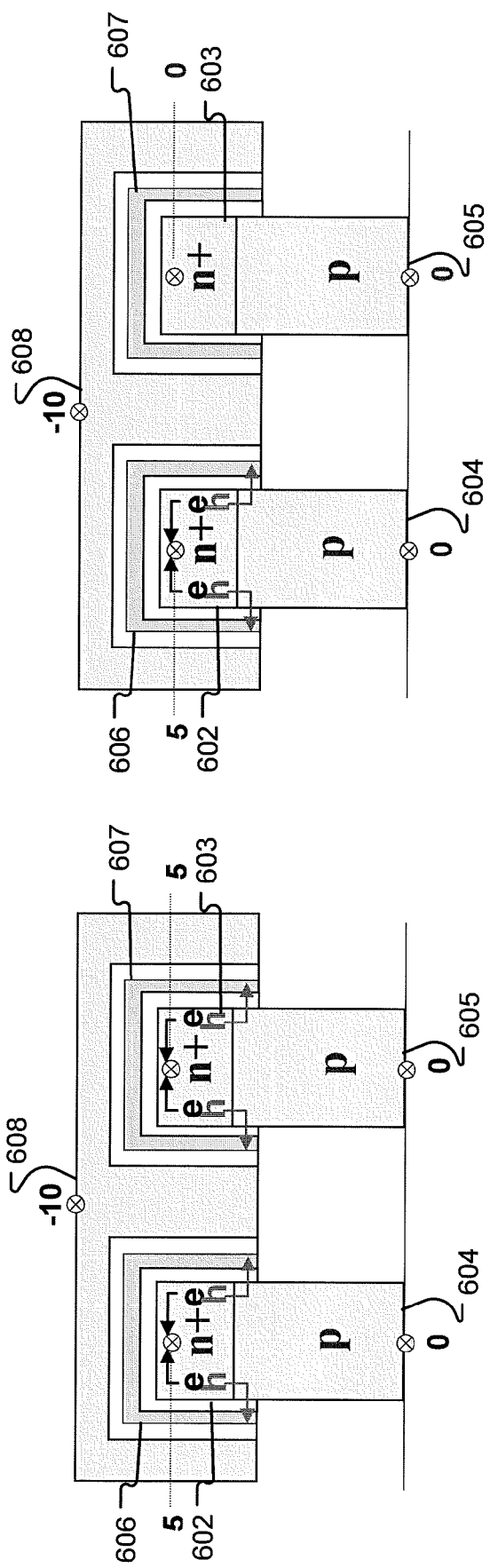

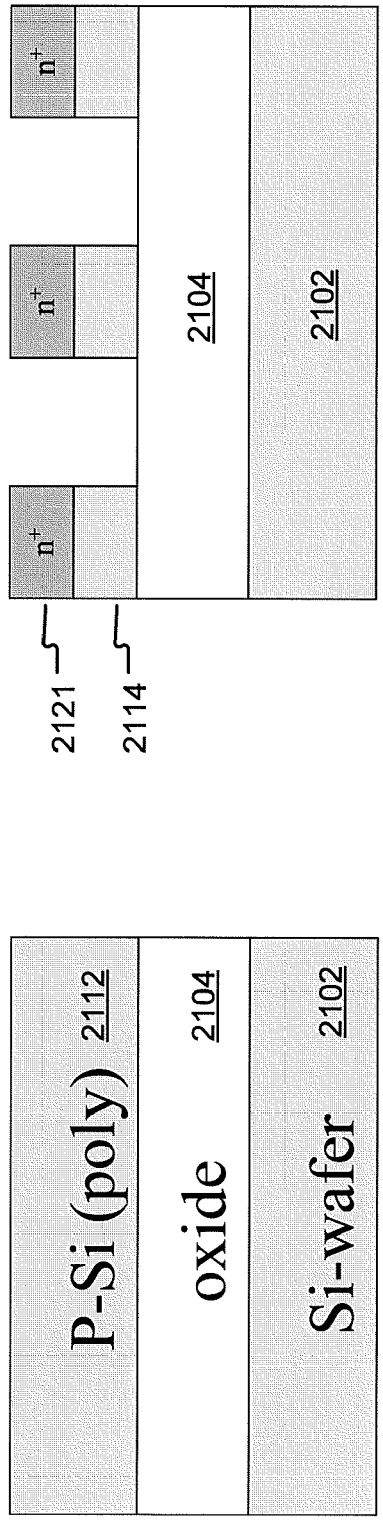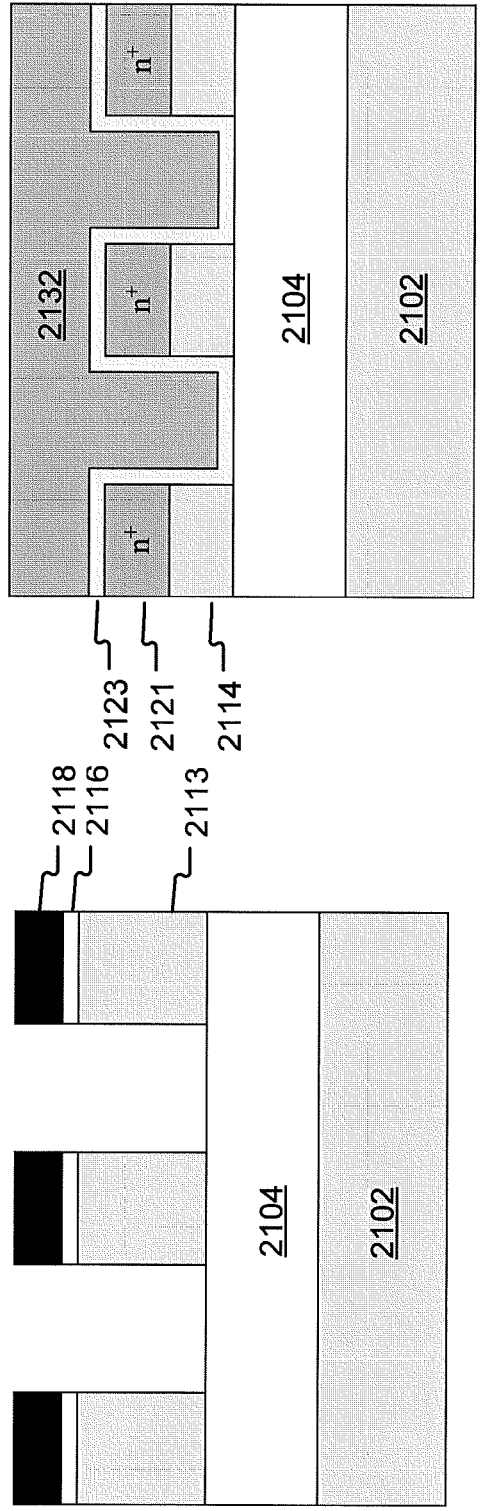

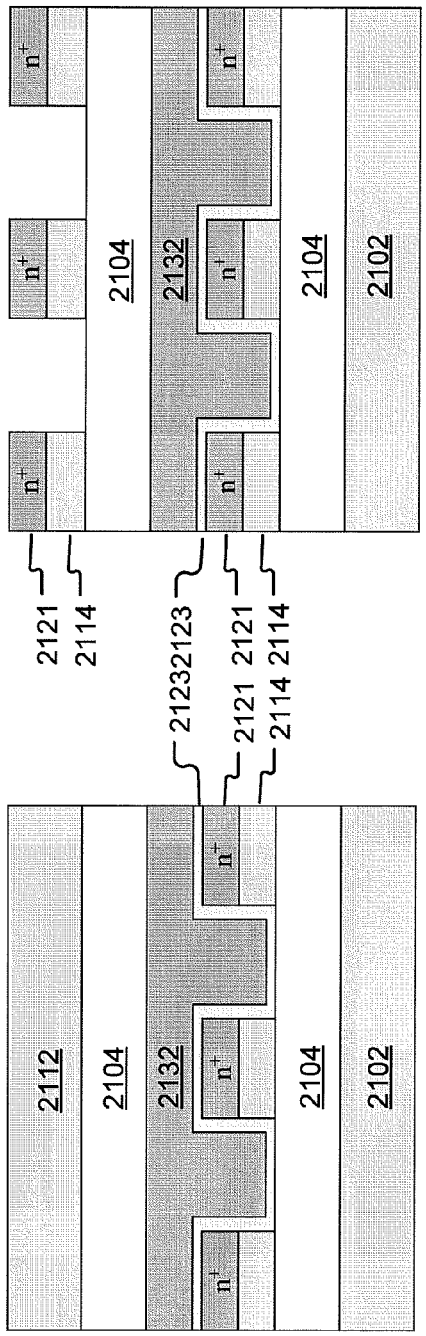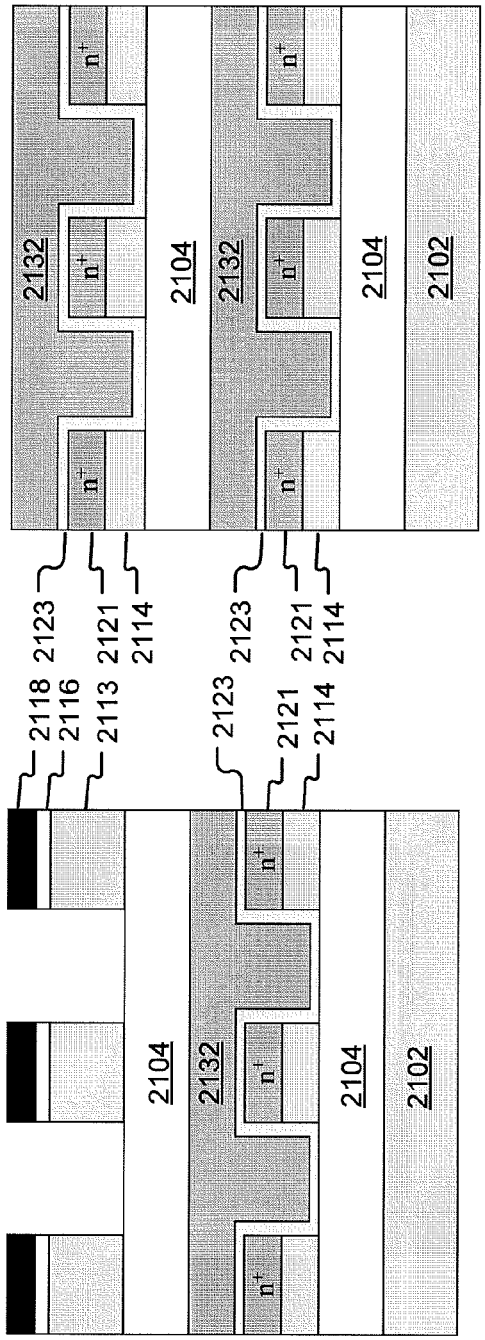

GATED DIODE NONVOLATILE MEMORY CELL ARRAY

RELATED APPLICATIONS

This application is a continuation of U.S. application No. Ser. 11/298,912, filed 9 Dec. 2005 now U.S. Pat. No. 7,283,389 by inventors Yi Ying Liao, Wen Jer Tsai and Chih Chieh Yeh entitled Gated Diode Nonvolatile Memory Cell Array. This application is incorporated herein by reference.

BACKGROUND OF THE INVENTION

1. Field of the Invention

The present invention relates to electrically programmable and erasable non-volatile memory, and more particularly to charge storage memory with a bias arrangement that reads the contents of the charge storage structure of the memory cell with great sensitivity.

2. Description of Related Art

Electrically programmable and erasable non-volatile memory technologies based on charge storage structures known as EEPROM and flash memory are used in a variety of modern applications. A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Various memory cell structures based on charge trapping dielectric layers include structures known by the industry names PHINES, NROM, and SONOS, for example. These memory cell structures store data by trapping charge in a charge trapping dielectric layer, such as silicon nitride. As more net negative charge is trapped, the threshold voltage of the memory cell increases. The threshold voltage of the memory cell is reduced by removing negative charge from, or adding positive charge to, the charge trapping layer.

Conventional memory cell structures rely on a transistor structure with source, drain, and gate. However, common transistor structures have drain and source diffusions that are laterally separated from each other by a self-aligned gate. This lateral separation is a factor that resists further miniaturization of nonvolatile memory.

Thus, a need exists for a nonvolatile memory cell that is open to further miniaturization and whose contents can be read with great sensitivity.

SUMMARY OF THE INVENTION

A gated diode nonvolatile memory device, an array of gated diode nonvolatile memory devices, methods of operating a gated diode nonvolatile memory device and an array of gated diode nonvolatile memory devices, and methods of manufacturing a gated diode nonvolatile memory device and an array of gated diode nonvolatile memory devices, are disclosed.

The gated diode nonvolatile memory device has a charge storage structure, dielectric structures(s), and a diode structure. Examples of a charge storage structure materials include floating gate material, charge trapping material, and nanocrystal material. Depending on the threshold voltage scheme of the charge storage structure, the charge storage state of the charge storage structure stores one bit or multiple bits.

The dielectric structures(s) are at least partly between the charge storage structure and the diode structure, and at least partly between the charge storage structure and a source of gate voltage, such as a word line. The diode structure has a first node and a second node separated by a junction. Example junctions of the diode are a homojunction, a heterojunction, and a graded heterojunction. Example diode structure with the first node and second node, include a pn diode and a Schottky diode.

The first node and the second node are at least partly adjacent to the one or more storage dielectric structures. The diode structure has a cross-section in which the second node has opposite sides isolated from neighboring devices by isolation dielectric. Despite this isolation dielectric on opposite side of the second node, the second node may be connected to neighboring devices. For example, if the neighboring devices are also gated diode nonvolatile memory devices, a lower portion of the second node beyond the isolation dielectric may be connected to neighboring devices via a second node of each of the neighboring devices. In this way, the same bit line combines the current flowing through diode structures otherwise separated by isolation dielectric. In another embodiment, the second node is connected to a bit line distinct from bit lines connected to second nodes of the neighboring devices. In this case, the second node does not have a lower portion beyond the isolation dielectric that is connected to neighboring devices.

Additional logic circuitry applies a bias arrangement to determine a charge storage state of the charge storage structure and to measure a read current flowing through the diode structure in reverse bias to determine the charge storage state of the charge storage structure. The read current includes a band-to-band read current component.

The bias arrangement applied by the logic circuitry causes multiple voltage differences in the gated diode nonvolatile memory device, such as a voltage difference between a source of gate voltage (typically a word line) and the second node of the diode structure, and another voltage difference between the first node and the second node of the diode structure. These voltage differences resulting from the bias arrangement cause sufficient band-to-band tunneling current for measuring the read current to determine the charge storage state of the charge storage structure. At the same time, these voltage differences fail to change the charge storage state of the charge storage structure. In one example, the voltage difference between the gate and the second node is at least about 10 V, and the voltage difference between the first node and the second node is at least about 2 V.

In addition to the bias arrangement for reading the contents of the gated diode nonvolatile memory device, other bias arrangements are applied to change the contents of the gated diode nonvolatile memory device. For example, other bias arrangements adjust the charge storage state of the charge storage structure by increasing a net positive charge in the charge storage structure, and by increasing a net negative charge in the charge storage structure. Example charge movement mechanisms to increase a net positive charge in the charge storage structure are band-to-band hot hole tunneling and Fowler-Nordheim tunneling. The electron movement can be between the charge storage structure and the diode structure, between the charge storage structure and the gate, or both.

Example charge movement mechanisms to increase a net negative charge in the charge storage structure are band-to-band hot electron tunneling and Fowler-Nordheim tunneling. The electron movement can be between the charge storage structure and the diode structure, between the charge storage structure and the source of gate voltage, or both.

An embodiment of a nonvolatile memory device integrated circuit includes an array of the gated diode nonvolatile memory devices. In some embodiments, to increase the storage density, multiple arrays that are vertically displaced from each other are combined. Depending on the addressing scheme used, the sources of gate voltage (typically word lines), the first nodes of the diode structures, and the second nodes of the diode structures, are interconnected between different vertically displaced arrays, or isolated between different vertically displaced arrays. Generally, a greater degree of interconnection simplifies the addressing and the fabrication, at the cost of increased power consumption from charging and discharging extra circuitry.

In one interconnection scheme, the word lines of different arrays are interconnected, but the first nodes and second nodes of different arrays are isolated from each other. In another interconnection scheme, the word lines of different arrays are isolated from each other, but the first nodes and second nodes of different arrays are interconnected. In yet another interconnection scheme, the word lines of different arrays, and the first nodes and second nodes of different arrays are isolated from each other.

Some embodiments of an array of gated diode nonvolatile memory cells include diode columns, gate rows, and nonvolatile storage structures. Each diode column has a first node column and a second node column separated by a junction. Opposite sides of the second node column are isolated from neighboring diode columns by isolation dielectric. The gate rows overlap the diode columns at intersections. These intersections are the locations of the nonvolatile storage structures. Typically, these nonvolatile storage structures are part of nonvolatile storage structure columns.

Each nonvolatile storage structure has a charge storage structure and one or more storage dielectric structures. The dielectric structures are at least partly between the charge storage structure and the particular diode column at the intersection, at least partly between the charge storage structure and the particular gate row at the intersection, and at least partly adjacent to the first node column and the second node column of the particular diode column at the intersection.

Despite this isolation of the second node column on opposite sides of the second node column, the second node column may be connected to neighboring diode columns. For example, a lower portion of the second node column beyond isolation dielectric may be connected to neighboring diode columns via the second node column of the neighboring diode columns. In this way, the same bit line combines the current flowing through diode structures otherwise isolated from each other. In another embodiment, the second node column is connected to a bit line distinct from bit lines connected to second nodes columns of the neighboring diode columns. In this case, the second node column does not have a lower portion beyond isolation dielectric that is connected to neighboring diode columns.

In some embodiments, the substrate region is a well in a semiconductor substrate. In other embodiments, the substrate region is simply the semiconductor substrate.

In other embodiments, the nonvolatile memory cell has a floating gate design or a nanocrystal design. In another embodiment, the nonvolatile memory cell has a charge trapping material design.

Applicant incorporates herein by reference U.S. patent application Ser. No. 11/024,339 filed on 28 Dec. 2004, now U.S. Pat. No. 7,130,215, U.S. patent application Ser. No. 11/023,747 now U.S. Pat. No. 7,072,219 filed on 28 Dec. 2004, U.S. patent application Ser. No. 11/024,075 filed 28 Dec. 2004 now U.S. Pat. No. 7,072,220, U.S. patent application Ser. No. 10/973,176 filed 26 Oct. 2004, U.S. Provisional Patent Application Ser. No. 60/608,528 filed 9 Sep. 2004, U.S. Provisional Patent Application Ser. No. 60/608,455 filed 9 Sep. 2004, U.S. patent application Ser. No. 10/973,593, filed 26 Oct. 2004, U.S. patent application Ser. No. 11/191,365 filed 28 Jul. 2005, U.S. patent application Ser. No. 11/191,366 filed 28 Jul. 2005, U.S. patent application Ser. No. 11/191,329 filed 28 Jul. 2005, U.S. patent application Ser. No. 11/191,367 filed 28 Jul. 2005, U.S. patent application Ser. No. 11/298,288 filed on 9 Dec. 2005 and U.S. patent application Ser. No. 11/299,310 filed on 9 Dec. 2005.

Other aspects and advantages of the technology presented herein can be understood with reference to the figures, the detailed description and the claims, which follow.

BRIEF DESCRIPTION OF THE DRAWINGS

FIGS. 8A and 8B are simplified diagrams of a gated diode nonvolatile memory cell operation performing hole tunnel injection.

FIGS. 17A and 17B are simplified diagrams of neighboring gated diode nonvolatile memory cells without interconnected second nodes, in which electron tunnel injection is performed on selected cells.

FIGS. 18A, 18B, and 18C are simplified diagrams of neighboring gated diode nonvolatile memory cells without interconnected second nodes, in which band-to-band hot hole injection is performed on selected cells.

FIGS. 21A-21H illustrate a sample process flow for multiple arrays of gated diode nonvolatile memory cells.

DETAILED DESCRIPTION

Figure 1:
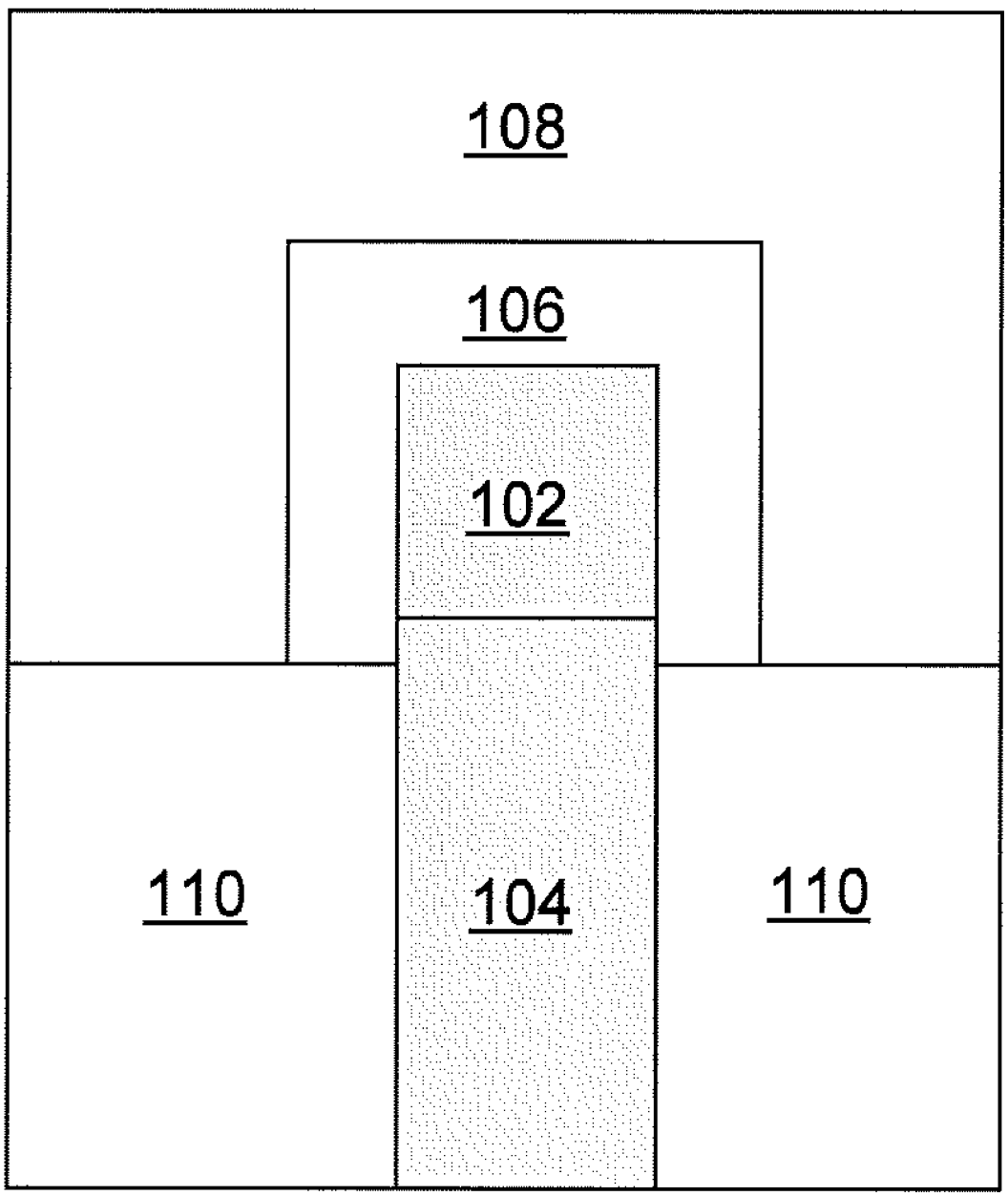
FIG. 1 is a simplified diagram of a gated diode nonvolatile memory cell.

FIG. 1 is a simplified diagram of a gated diode nonvolatile memory cell. Nodes 102 and 104 form a diode separated by a junction. A combined charge storage and dielectric structure 106 substantially surrounds the first diode node 102. The combined charge storage and dielectric structure 106 is also partly adjacent to the second diode node 104. In this cross-sectional view, dielectric 110 on either side of the second diode node 104 isolates the second diode node 104 from neighboring devices, such as other gated diode nonvolatile memory cells. The gate structure 108 applies a gate voltage.

Figure 2C:
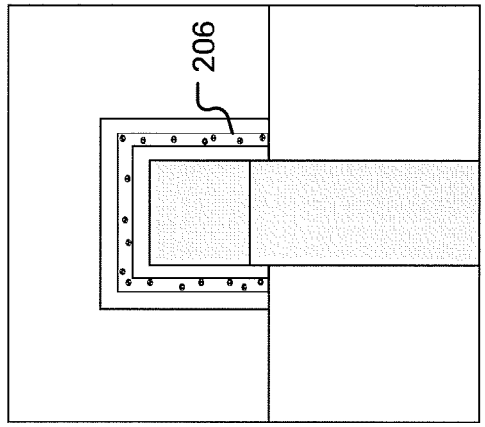
FIGS. 2A, 2B, and 2C are simplified diagrams of a gated diode nonvolatile memory cell, showing various charge storage structures having different materials.
Figure 2B:
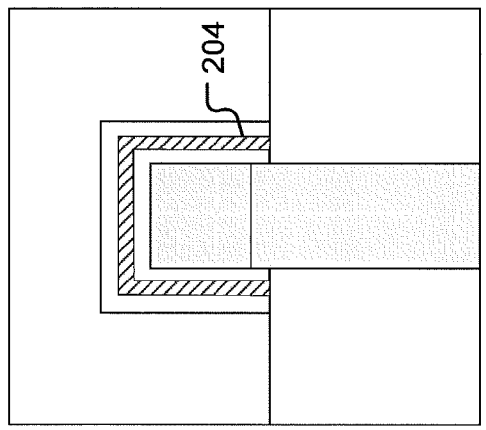
Figure 2A:
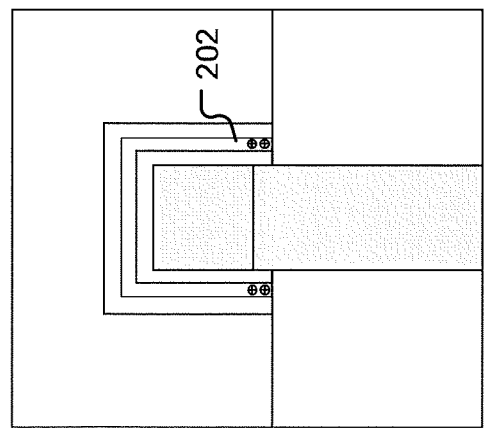

FIGS. 2A, 2B, and 2C are simplified diagrams of a gated diode nonvolatile memory cell, showing various charge storage structures having different materials. In FIG. 2A, a charge trapping material structure 202 locally stores charge, schematically shown here as positive charge on the portion of the charge trapping material near the diode junction. Oxide structures are between the charge trapping material structure 202 and the gate structure, and between the charge trapping material structure 202 and the diode structure. Representative dielectrics between the charge trapping material structure 202 and the gate structure include silicon dioxide and silicon oxynitride having a thickness of about 5 to 10 nanometers, or other similar high dielectric constant materials including for example $Al_2O_3$. Representative between the charge trapping material structure 202 and the diode structure include silicon dioxide and silicon oxynitride having a thickness of about 2 to 10 nanometers, or other similar high dielectric constant materials.

Representative charge trapping structures include silicon nitride having a thickness of about 3 to 9 nanometers, or other similar high dielectric constant materials, including metal oxides such as $Al_2O_3$, $HfO_2$, and others.

In some embodiments, the gate structure comprises a material having a work function greater than the intrinsic work function of n-type silicon, or greater than about 4.1 eV, and preferably greater than about 4.25 eV, including for example greater than about 5 eV. Representative gate materials include p-type poly, TiN, Pt, and other high work function metals and materials. Other materials having a relatively high work function suitable for embodiments of the technology include metals including but not limited to Ru, Ir, Ni, and Co, metal alloys including but not limited to Ru—Ti and Ni-T, metal nitrides, and metal oxides including but not limited to $RuO_2$. High work function gate materials result in higher injection barriers for electron tunneling than that of the typical n-type polysilicon gate. The injection barrier for n-type polysilicon gates with silicon dioxide as the outer dielectric is around 3.15 eV. Thus, embodiments of the present technology use materials for the gate and for the outer dielectric having an injection barrier higher than about 3.15 eV, such as higher than about 3.4 eV, and preferably higher than about 4 eV. For p-type polysilicon gates with silicon dioxide outer dielectrics, the injection barrier is about 4.25 eV, and the resulting threshold of a converged cell is reduced about 2 volts relative to a cell having an n-type polysilicon gate with a silicon dioxide outer dielectric.

FIG. 2B shows a gated diode nonvolatile memory cell resembling the gated diode nonvolatile memory cell of FIG. 2A, but with a floating gate 204, often made of polysilicon. FIG. 2C shows a gated diode nonvolatile memory cell resembling the nonvolatile memory cell of FIG. 2A, but with a nanoparticle charge storage structure 206.

Each charge storage structure can store one bit or multiple bits. For example, if each charge storage structure stores two bits, then there are four discrete levels of charge stored by the gated diode nonvolatile memory cell.

In some embodiments, programming refers to making more positive the net charge stored in the charge trapping structure, such as by the addition of holes to or the removal of electrons from the charge storage structure; and erasing refers to making more negative the net charge stored in the charge storage structure, such as by the removal of holes from or the addition of electrons to the charge trapping structure. However, in other embodiments programming refers to making the net charge stored in the charge storage structure more negative, and erasing refers to making the net charge stored in the charge storage structure more positive. Various charge movement mechanisms are used, such as band-to-band tunneling induced hot carrier injection, E-field induced tunneling, and direct tunneling from the substrate.

Figure 3D:
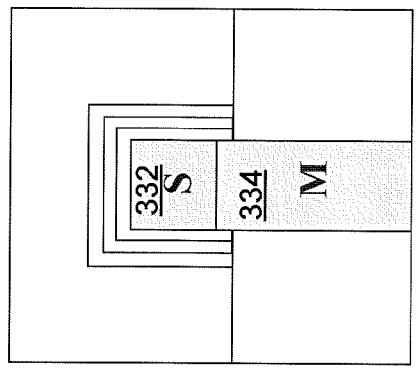
FIGS. 3A, 3B, 3C, and 3D are simplified diagrams of a gated diode nonvolatile memory cell, showing various examples of a diode structure, such as the pn diode and the Schottky diode.
Figure 3C:
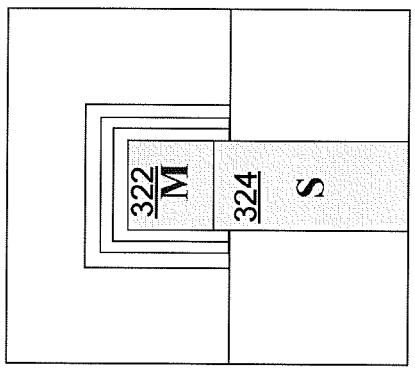
Figure 3B:
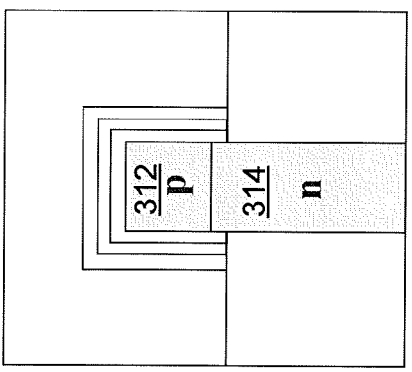
Figure 3A:
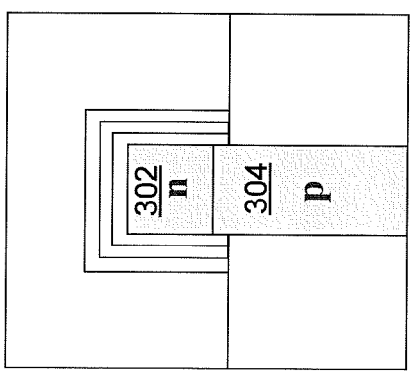

FIGS. 3A, 3B, 3C, and 3D are simplified diagrams of a gated diode nonvolatile memory cell, showing various examples of a diode structure, such as the pn diode and the Schottky diode. In FIGS. 3A and 3B, the diode structure is a pn diode. In FIG. 3A, the first node 302 substantially surrounded by the combined charge storage and dielectric structure is doped n-type, and the second node 304 is doped p-type. The gated diode nonvolatile memory cell of FIG. 3B interchanges the node materials of FIG. 3A, such that the first node 312 substantially surrounded by the combined charge storage and dielectric structure is doped p-type, and the second node 314 is doped n-type. In FIGS. 3C and 3D, the diode structure is a Schottky diode. In FIG. 3C, the first node 322 substantially surrounded by the combined charge storage and dielectric structure is a metal material, and the second node 324 is a semiconductor material. The gated diode nonvolatile memory cell of FIG. 3D interchanges the node materials of FIG. 3C, such that the first node 332 substantially surrounded by the combined charge storage and dielectric structure is a semiconductor material, and the second node 334 is a metal material.

Figure 4B:
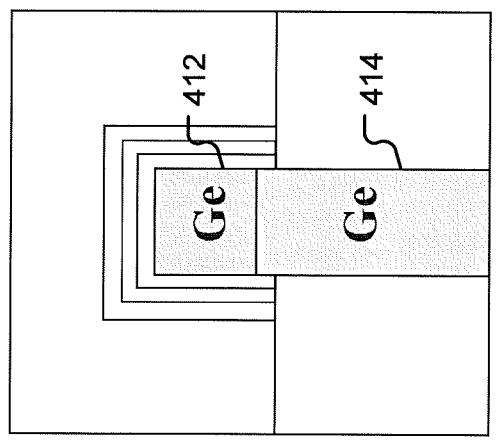
FIGS. 4A and 4B are simplified diagrams of a gated diode nonvolatile memory cell, showing examples of a pn diode with a homojunction.
Figure 4A:
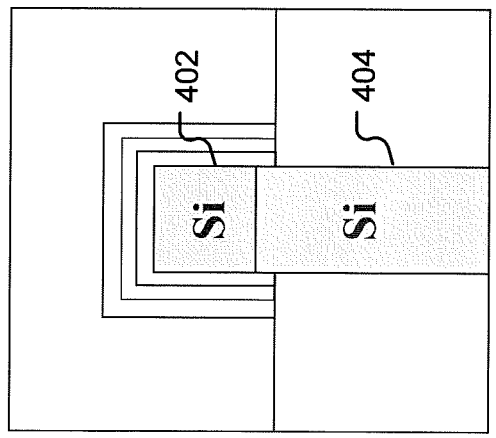

FIGS. 4A and 4B are simplified diagrams of a gated diode nonvolatile memory cell, showing examples of a pn diode with a homojunction. In FIG. 4A, both the first node 402 and the second 404 of the diode structure are silicon. In FIG. 4B, both the first node 412 and the second 414 of the diode structure are germanium. Because of the smaller bandgap of germanium compared to silicon, the gated diode nonvolatile memory cell tends to generate a greater band-to-band current with the configuration of FIG. 4B than with the configuration of FIG. 4A. Regardless of the material used in the homojunction diode structure, the diode structure can be single crystal or polycrystalline. A polycrystalline design results in higher memory cell density, due to the ability to deposit multiple layers of memory cells in the vertical direction.

Figure 5:
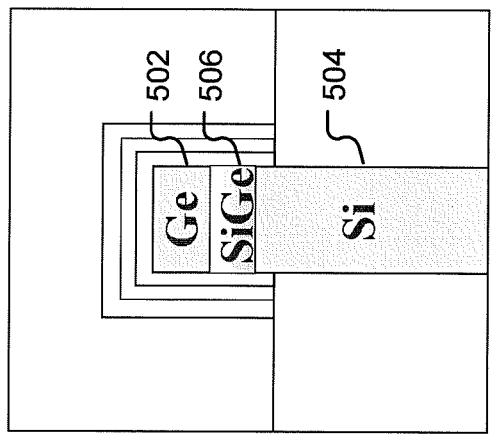
FIG. 5 is a simplified diagram of a gated diode nonvolatile memory cell, showing an example of a pn diode with a heterojunction.

FIG. 5 is a simplified diagram of a gated diode nonvolatile memory cell, showing an example of a pn diode with a heterojunction. The first node 502 substantially surrounded by the combined charge storage and dielectric structure is germanium. The second node 504 is silicon. The first node 502 and the second node 504 are joined by a graded transition layer junction 506.

Figure 6B:
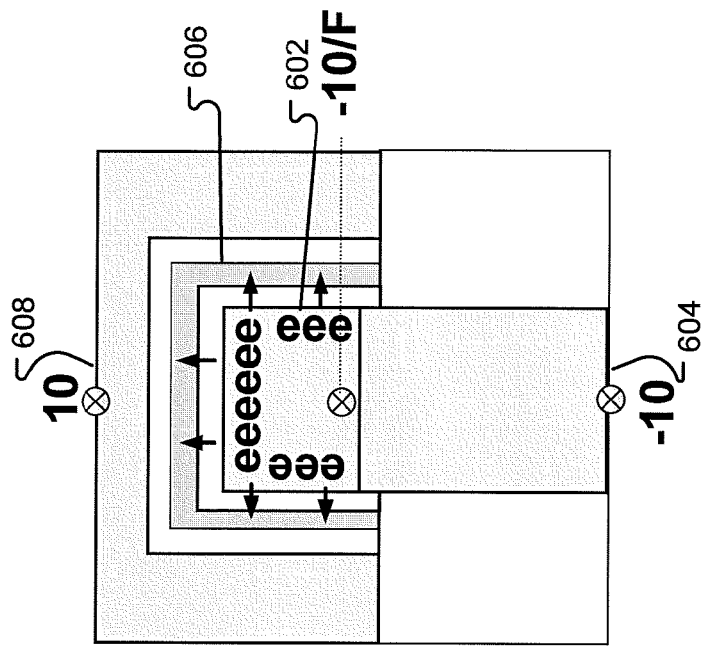
FIGS. 6A and 6B are simplified diagrams of a gated diode nonvolatile memory cell operation performing electron tunnel injection.
Figure 6A:
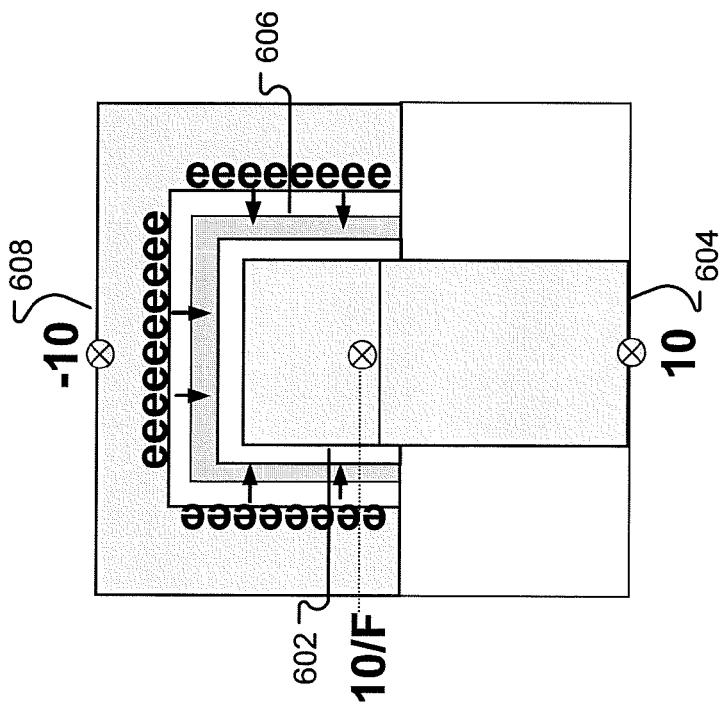

FIGS. 6A and 6B are simplified diagrams of a gated diode nonvolatile memory cell operation performing electron tunnel injection. In FIG. 6A, the electron tunnel injection mechanism moves electrons from the gate structure 608 biased at −10 V to the charge storage structure 606. The first diode node is biased at 10 V or is floating, and the second diode node 604 is biased at 10 V. In FIG. 6B, the electron tunnel injection mechanism moves electrons from the first diode node 602 biased at −10 V or is floating, to the charge storage structure 606. The gate structure 608 is biased at 10 V, and the second diode node 604 is biased at −10 V.

Figure 7B:
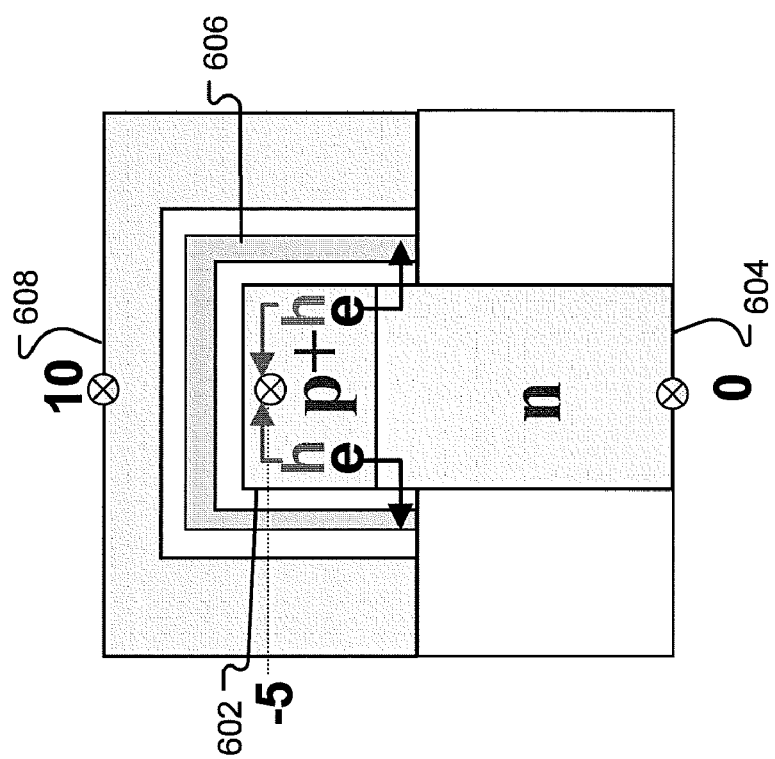
FIGS. 7A and 7B are simplified diagrams of a gated diode nonvolatile memory cell operation performing band-to-band hot electron injection.
Figure 7A:
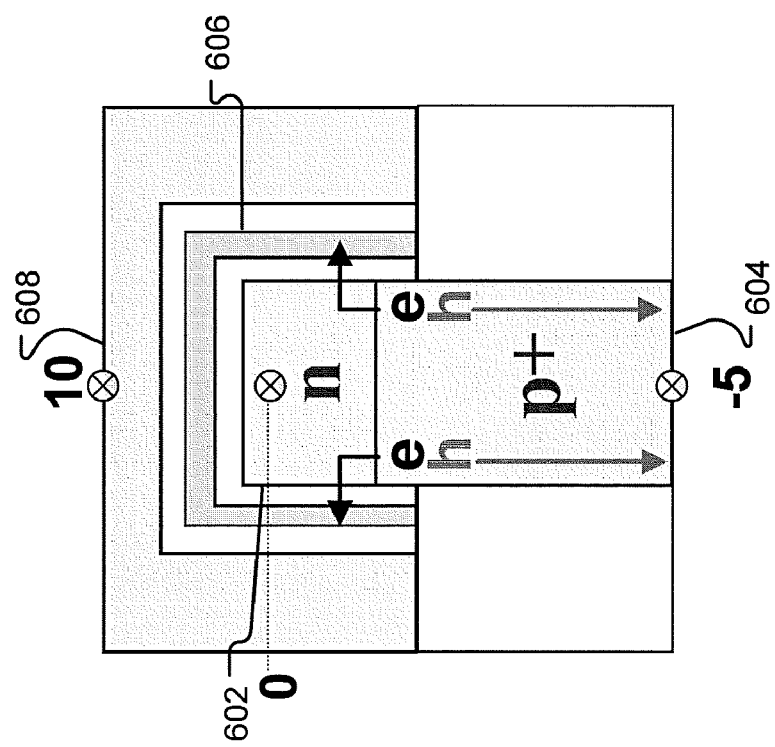

FIGS. 7A and 7B are simplified diagrams of a gated diode nonvolatile memory cell operation performing band-to-band hot electron injection. In FIG. 7A, the band-to-band hot electron injection moves electrons from the diode structure to the charge storage structure 606. The n-type first diode node 602 biased at 0 V, the gate structure 608 is biased at 10 V, and holes of the resulting electron-hole pairs flow into the p+-type second node 604 biased at −5 V. In FIG. 7B, the band-to-band hot electron injection moves electrons from the diode structure to the charge storage structure 606. The n-type second diode node 604 biased at 0 V, the gate structure 608 is biased at 10 V, and holes of the resulting electron-hole pairs flow into the p+-type first node 602 is biased at −5 V.

FIGS. 8A and 8B are simplified diagrams of a gated diode nonvolatile memory cell operation performing hole tunnel injection. In FIG. 8A, the hole tunnel injection mechanism moves holes from the gate structure 608 biased at 10 V to the charge storage structure 606. The first diode node is biased at −10 V or is floating, and the second diode node 604 is biased at −10 V. In FIG. 8B, the hole tunnel injection mechanism moves holes from the first diode node 602 biased at 10 V or is floating, to the charge storage structure 606. The gate structure 608 is biased at −10 V, and the second diode node 604 is biased at 10 V.

Figure 9B:
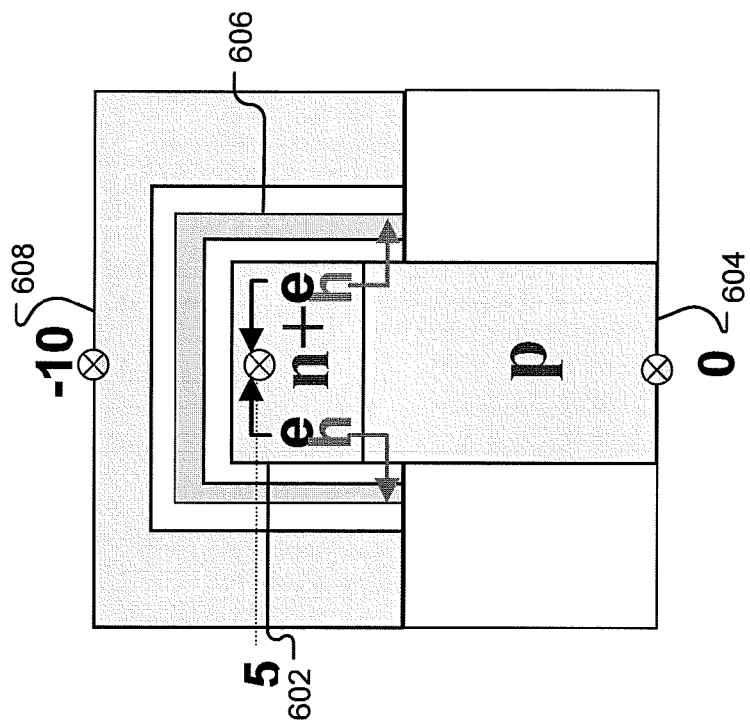
FIGS. 9A and 9B are simplified diagrams of a gated diode nonvolatile memory cell operation performing band-to-band hot hole injection.
Figure 9A:
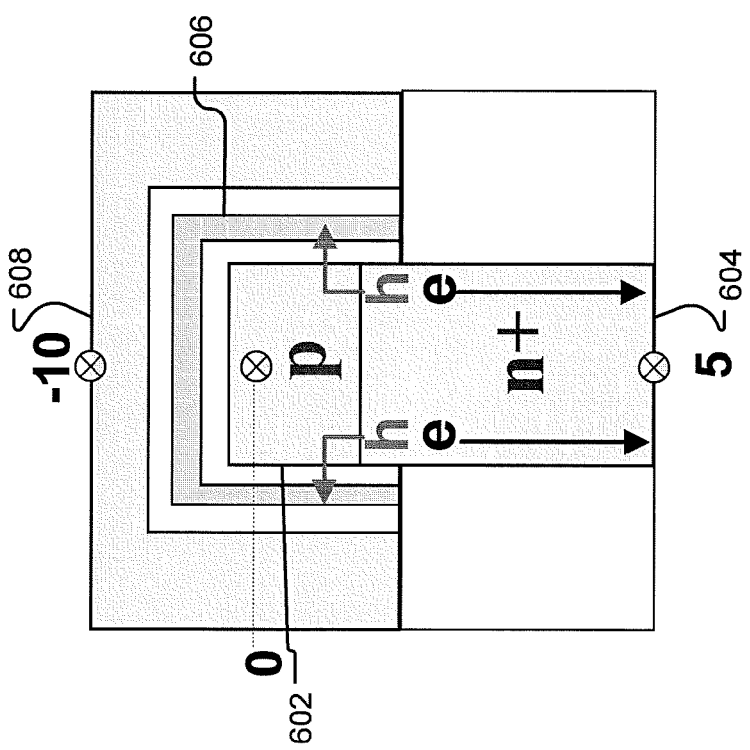

FIGS. 9A and 9B are simplified diagrams of a gated diode nonvolatile memory cell operation performing band-to-band hot hole injection. In FIG. 9A, the band-to-band hot hole injection moves holes from the diode structure to the charge storage structure 606. The p-type first diode node 602 is biased at 0 V, the gate structure 608 is biased at −10 V, and electrons of the resulting electron-hole pairs flow into the n+-type second node 604 is biased at 5 V. In FIG. 9B, the band-to-band hot hole injection moves holes from the diode structure to the charge storage structure 606. The p-type second diode node 604 is biased at 0 V, the gate structure 608 is biased at −10 V, and electrons of the resulting electron-hole pairs flow into the n+-type first node 602 biased at 5 V.

Band-to-band currents flowing through the diode structure determine the charge storage state of the charge storage structure with great precision, due to combined vertical and lateral electrical fields. Larger vertical and lateral electrical fields give rise to larger band-to-band currents. A bias arrangement is applied to the various terminals, such that the energy bands bend sufficiently to cause band-to-band current in the diode structure, while keeping the potential difference between the diode nodes sufficiently low enough such that programming or erasing does not occur.

In example bias arrangements, the diode structure is reverse biased. Additionally, the voltage of the gate structure causes the energy bands to bend sufficiently such that band-to-band tunneling occurs through the diode structure. A high doping concentration in the one of the diode structure nodes, with the resulting high charge density of the space charge region, and the accompanying short length of the space charge region over which the voltage changes, contributes to the sharp energy band bending. Electrons in the valence band on one side of the diode structure junction tunnel through the forbidden gap to the conduction band on the other side of the diode structure junction and drift down the potential hill, deeper into the n-type diode structure node. Similarly, holes drift up the potential hill, away from either n-type diode structure node, and toward the p-type diode structure node.

The voltage of the gate structure controls the voltage of the portion of the diode structure by the dielectric structure which is between the diode structure and the charge storage structure. As the voltage of the gate structure becomes more negative, the voltage of the portion of the diode structure by this dielectric structure becomes more negative, resulting in deeper band bending in the diode structure. More band-to-band current flows, as a result of at least some combination of 1) an increasing overlap between occupied electron energy levels on one side of the bending energy bands, and unoccupied electron energy levels on the other side of bending energy bands, and 2) a narrower barrier width between the occupied electron energy levels and the unoccupied electron energy levels (Sze, *Physics of Semiconductor Devices*, 1981).

The net negative or net positive charge stored on the charge storage structure further affects the degree of band bending. In accordance with Gauss's Law, when a negative voltage is applied to the gate structure relative to the diode structure, a stronger electric field is experienced by portions of the diode structure which are near portions of the charge storage structure having relatively higher net negative charge. Similarly, when a positive voltage is applied to the gate structure relative to the diode structure, a stronger electric field is experienced by portions of the diode structure which are near portions of the charge storage structure having relatively higher net positive charge.

The different bias arrangements for reading, and bias arrangements for programming and erasing, show a careful balance. For reading, the potential difference between the diode structure terminals should not cause a substantial number of charge carriers to transit a dielectric to the charge storage structure and affect the charge storage state. In contrast, for programming and erasing, the potential difference between the diode structure terminals can be sufficient to cause a substantial number of carriers to transit a dielectric and affect the charge storage state by band-to-band hot carrier injection.

Figure 10B:
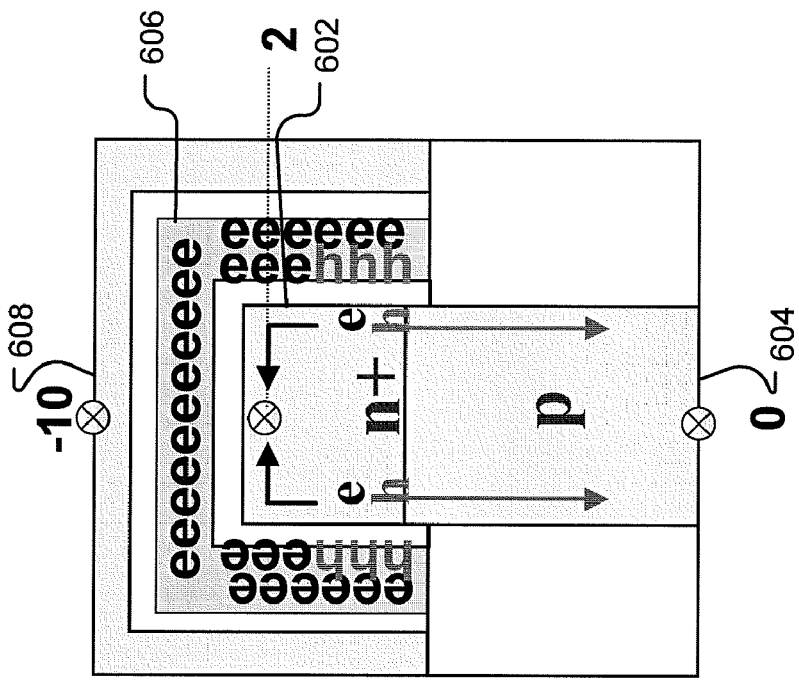
FIGS. 10A and 10B are simplified diagrams of a gated diode nonvolatile memory cell operation performing band-to-band sensing with different amounts of net positive or net negative charge characterizing the charge storage structure.
Figure 10A:
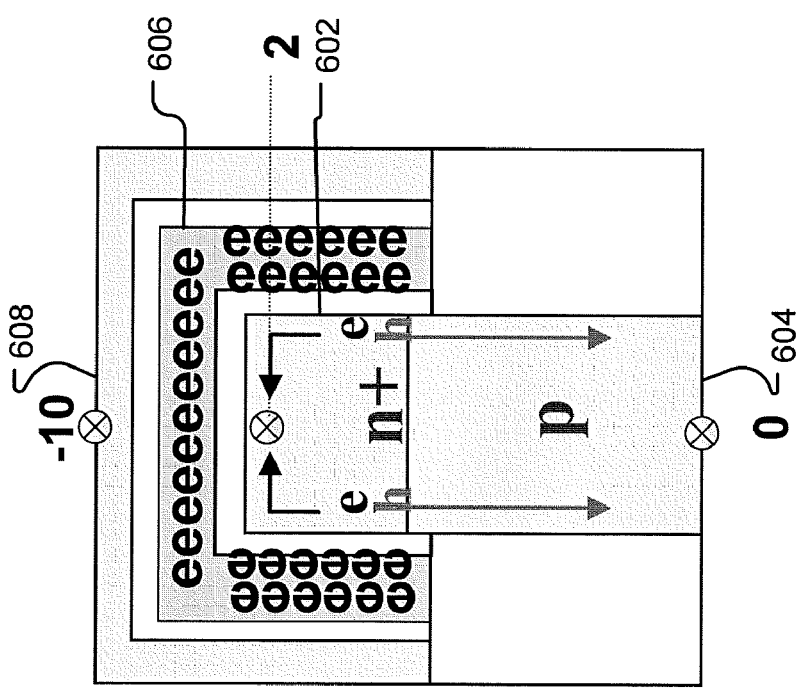

FIGS. 10A and 10B are simplified diagrams of a gated diode nonvolatile memory cell operation performing band-to-band sensing with different amounts of net positive or net negative charge characterizing the charge storage structure. In FIGS. 10A and 10B, band-to-band sensing mechanism creates electron-hole pairs in the diode structure. Resulting electrons flow into the n+-type first diode node 602 biased at 2 V, and resulting holes flow into the p-type second diode node 604 biased at 0 V. The gate structure 608 is biased at −10 V. In FIG. 10A, the charge storage structure 606 stores relatively more negative net charge by the diode structure junction between the n+-type first diode node 602 and the p-type second diode node 604. In FIG. 10B, the charge storage structure 606 stores relatively more positive net charge by the diode structure junction between the n+-type first diode node 602 and the p-type second diode node 604. Greater band bending in the diode structure occurs in FIG. 10A than in FIG. 10B, and greater band-to-band sensing current flows in FIG. 10A than in FIG. 10B.

Figure 11B:
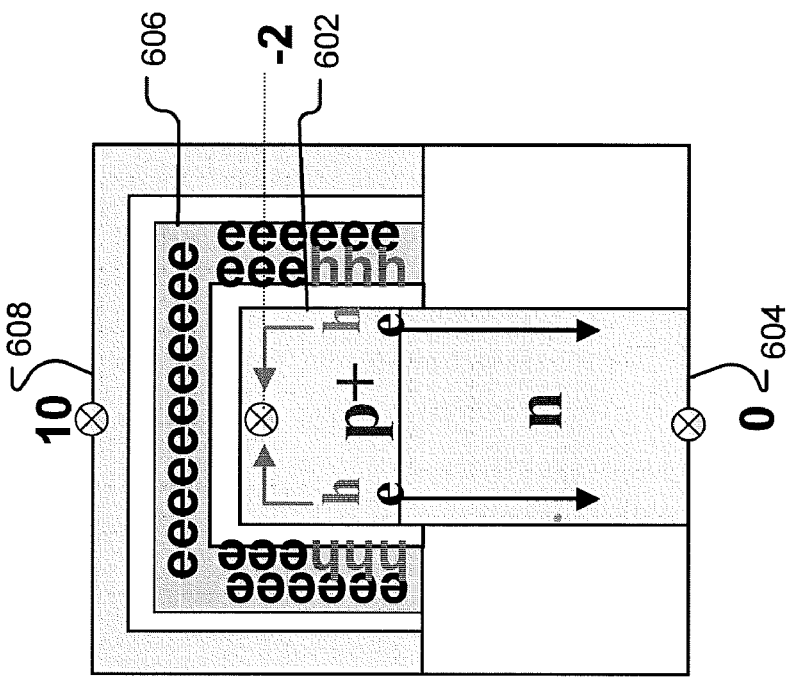
FIGS. 11A and 11B are simplified diagrams of a gated diode nonvolatile memory cell operation performing band-to-band sensing with different amounts of net positive or net negative charge characterizing the charge storage structure, but with a different diode node arrangement than in FIGS. 10A and 10B.
Figure 11A:
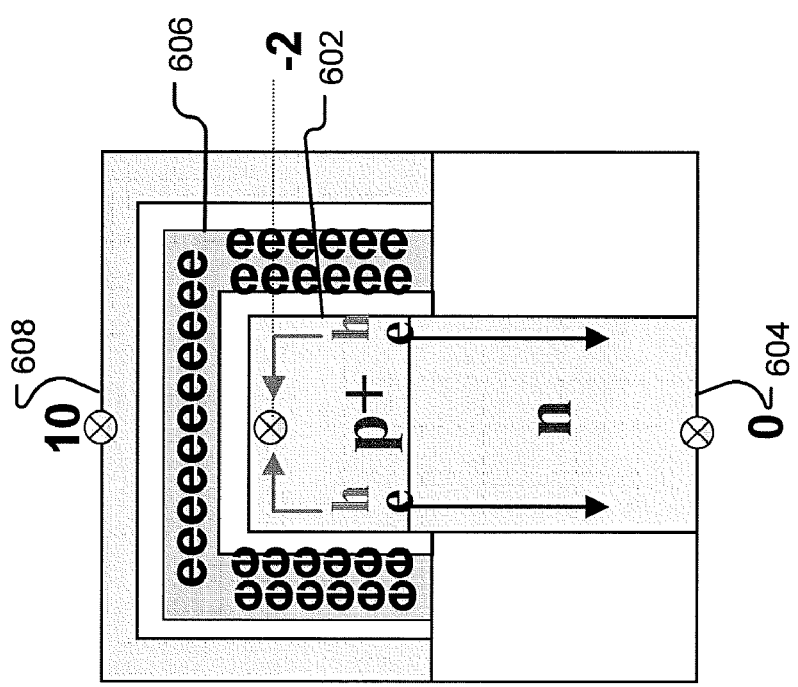

FIGS. 11A and 11B are simplified diagrams of a gated diode nonvolatile memory cell operation performing band-to-band sensing with different amounts of net positive or net negative charge characterizing the charge storage structure, but with a different diode node arrangement from FIGS. 10A and 10B. In particular, the first node 602 of the diode structure substantially surrounded by the combined charge storage and dielectric structure is p+-type, and the second node of the diode structure 604 is n-type. The band-to-band sensing mechanism creates electron-hole pairs in the diode structure. Resulting holes flow into the p+-type first diode node 602 biased at −2 V, and resulting electrons flow into the n-type second diode node 604 biased at 0 V. The gate structure 608 is biased at 10 V. In FIG. 11A, the charge storage structure 606 stores relatively more negative net charge by the diode structure junction between the p+-type first diode node 602 and the n-type second diode node 604. In FIG. 11B, the charge storage structure 606 stores a relatively more positive net charge by the diode structure junction between the p+-type first diode node 602 and the n-type second diode node 604. Greater band bending in the diode structure occurs in FIG. 11B than in FIG. 11A, and greater band-to-band sensing current flows in FIG. 11B than in FIG. 11A.

In other embodiments, the more heavily doped node is the second node of the diode structure, and the less heavily doped node is the first node of the diode structure substantially surrounded by the combined charge storage and dielectric structure.

Figure 12B:
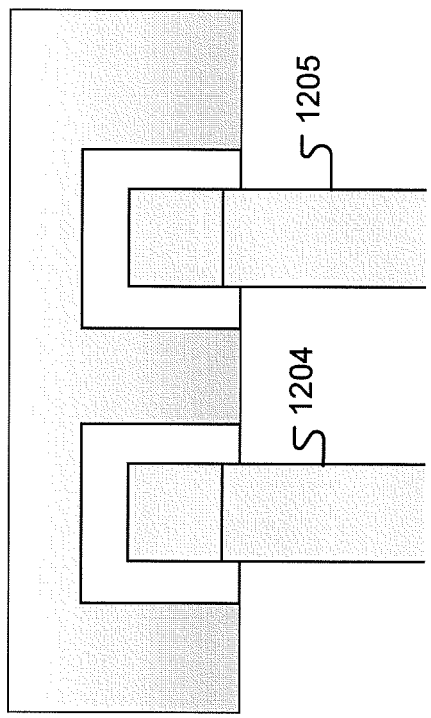
FIGS. 12A and 12B are simplified diagrams of neighboring gated diode nonvolatile memory cells, with and without interconnected second nodes.
Figure 12A:
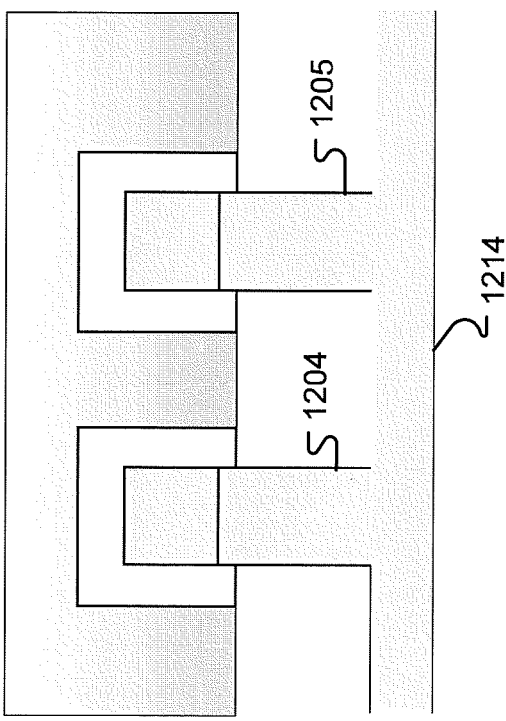

FIGS. 12A and 12B are simplified diagrams of neighboring gated diode nonvolatile memory cells, with and without interconnected second nodes. In FIG. 12A, neighboring gated diode nonvolatile memory cells respectively have second nodes 1204 and 1205. Both second nodes 1204 and 1205 of the neighboring gated diode nonvolatile memory cells extend beyond the oxide which isolates the upper portions of the second nodes 1204 and 1205 from each other, and connect into a common node structure 1214. This common node structure is treated as a same bit line used by both neighboring gated diode nonvolatile memory cells. In FIG. 12B, both second nodes 1204 and 1205 of the neighboring gated diode nonvolatile memory cells do not extend beyond the oxide which isolates the second nodes 1204 and 1205 from each other. Each of the second nodes 1204 and 1205 is treated as a distinct bit line, and the two second nodes 1204 and 1205 are not treated as a same bit line.

Figure 13A:
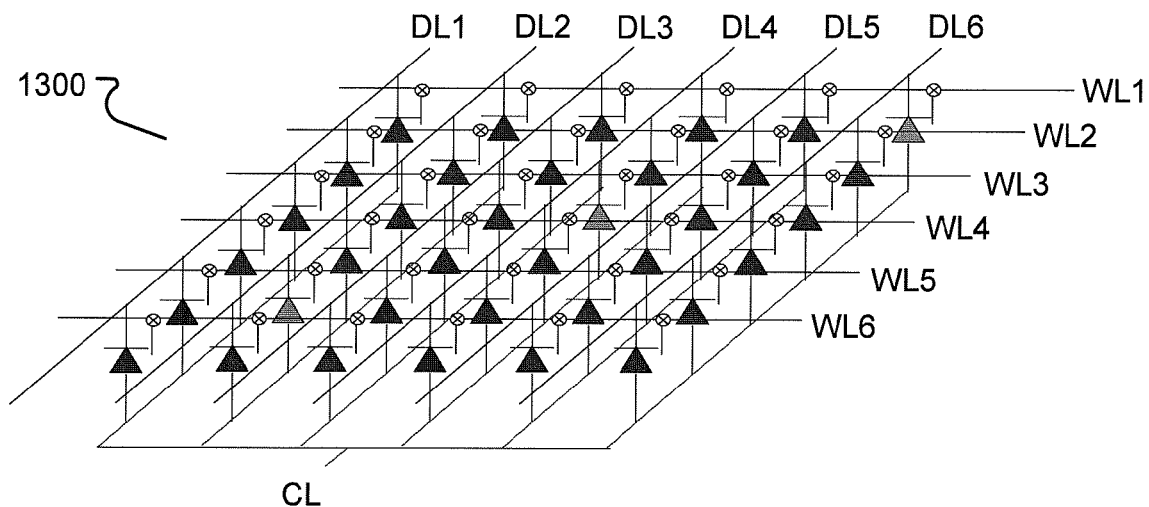
FIGS. 13A and 13B are simplified diagrams of an array of gated diode nonvolatile memory cells with interconnected second node columns, performing band-to-band sensing.
Figure 13B:
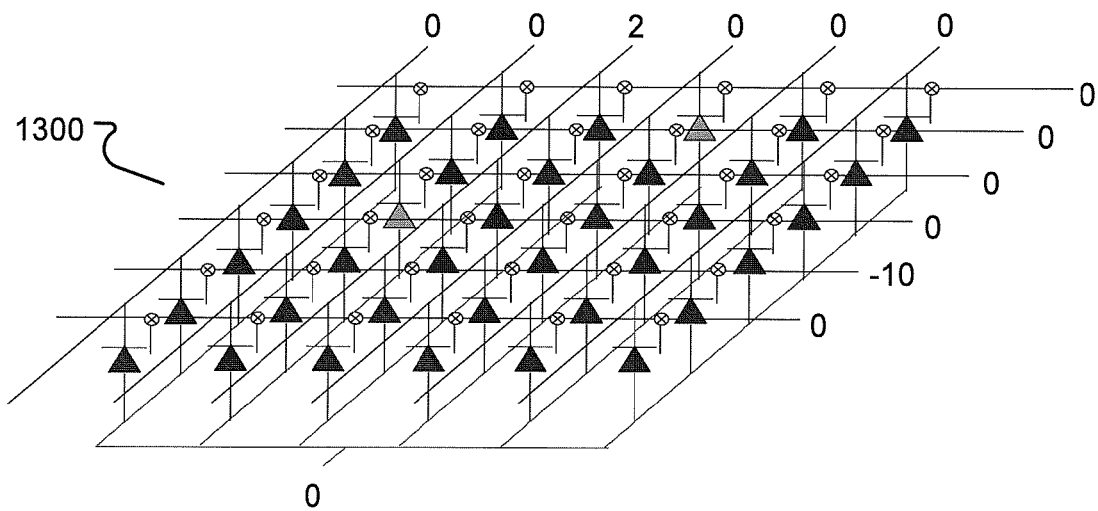

FIGS. 13A and 13B are simplified diagrams of an array of gated diode nonvolatile memory cells with interconnected second node columns, performing band-to-band sensing. The first node columns of the diode structures substantially surrounded by the combined charge storage and dielectric structures are n-type, and the second node columns of the diode structures are p-type. Neighboring second node columns of the diode structures extend beyond the oxide which isolates the upper portions of the second node columns from each other, and connect into a common bit line structure. In FIG. 13A, the first node columns of the diode structures are shown with bit line labels DL1 to DL6, the second node columns of the diode structures are shown with the bit line label CL, and the word lines are shown with word line labels WL1 to WL6. In FIG. 13B, voltages are applied to the diode columns and the word lines. The first node column DL3 is biased at 2 V, and the remaining first node columns are biased at 0 V. The second node columns are biased at 0 V. The word line WL5 is biased at −10 V, and the remaining word lines are biased at 0 V. A band-to-band sensing operation is thereby performed on the gate diode memory cell at the intersection of word line WL5 and the first node column DL3. By measuring the current flowing through the first node column DL3 or the second node columns CL, the charge storage state of the charge storage structure of that gate diode memory cell is determined.

Figure 14A:
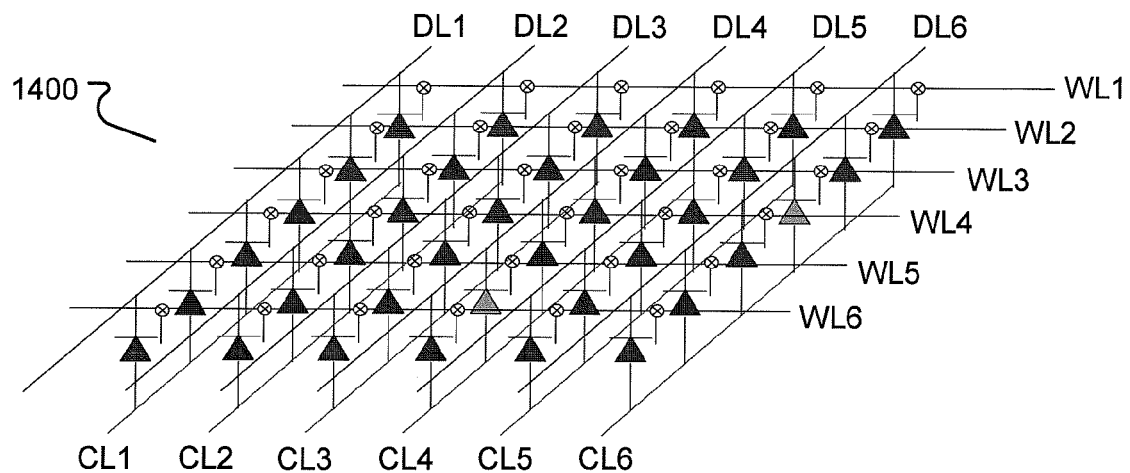
FIGS. 14A and 14B are simplified diagrams of an array of gated diode nonvolatile memory cells without interconnected second node columns, performing band-to-band sensing.
Figure 14B:
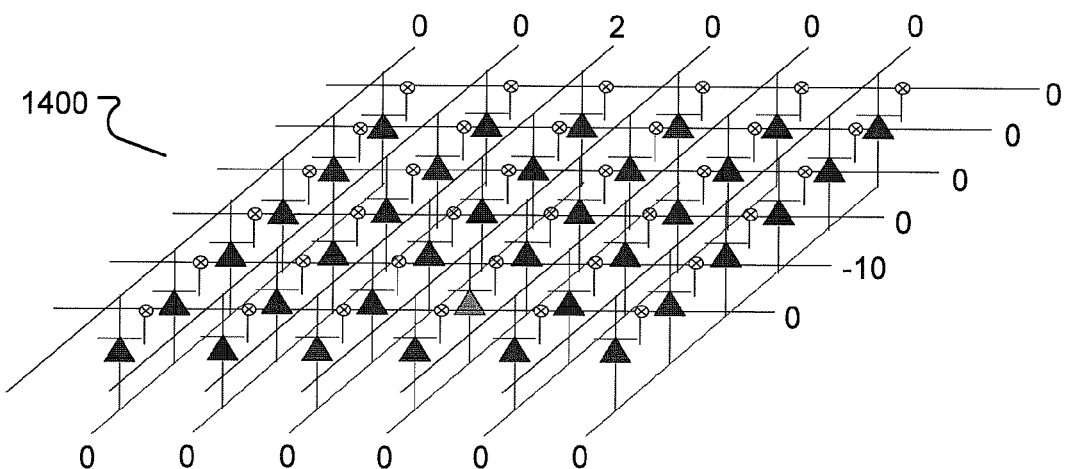

FIGS. 14A and 14B are simplified diagrams of an array of gated diode nonvolatile memory cells without interconnected second node columns, performing band-to-band sensing. Unlike the interconnected common bit line structure of the second node columns shown in FIGS. 13A and 13B, in FIGS. 14A and 14B neighboring second node columns of the diode structures are treated as distinct bit lines. In FIG. 14A, the second node columns of the diode structures are shown with bit line labels CL1 to CL6. In FIG. 14B, voltages are applied to the diode columns and the word lines. The first node column DL3 is biased at 2 V, and the remaining first node columns are biased at 0 V. The second node columns are biased at 0 V. The word line WL5 is biased at −10 V, and the remaining word lines are biased at 0 V. A band-to-band sensing operation is thereby performed on the gate diode memory cell at the intersection of word line WL5 and the first node column DL3/second node column CL3. By measuring the current flowing through the first node column DL3 or second node column CL3, the charge storage state of the charge storage structure of that gate diode memory cell is determined.

Figure 15A:
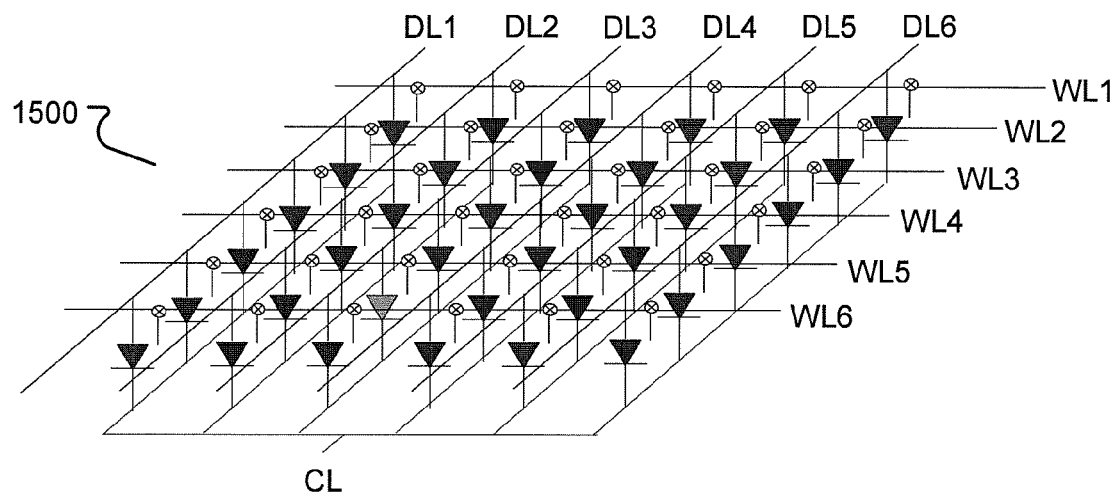
FIGS. 15A and 15B are simplified diagrams of an array of gated diode nonvolatile memory cells with interconnected second node columns, performing band-to-band sensing, where the doping arrangement of the diode structures is different from FIGS. 13A, 13B, 14A, and 14B.
Figure 15B:
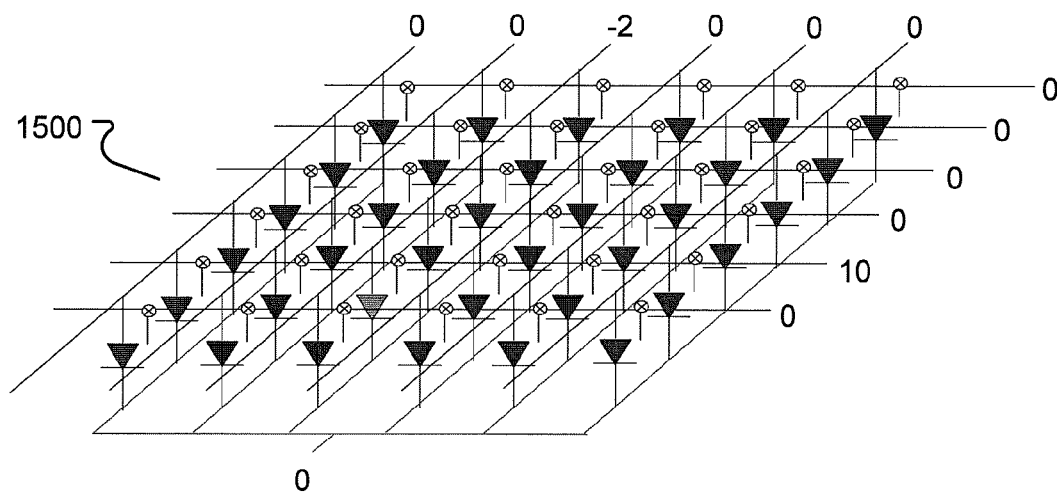

FIGS. 15A and 15B are simplified diagrams of an array of gated diode nonvolatile memory cells with interconnected second node columns, performing band-to-band sensing, where the doping arrangement of the diode structures is different from FIGS. 13A, 13B, 14A, and 14B. In FIGS. 15A and 15B, the first node columns of the diode structures substantially surrounded by the combined charge storage and dielectric structures are p-type, and the second node columns of the diode structures are n-type. Like FIGS. 13A and 13B, neighboring second node columns of the diode structures extend beyond the oxide which isolates the upper portions of the second node columns from each other, and connect into a common bit line structure. In FIG. 15A, the first node columns of the diode structures are shown with bit line labels DL1 to DL6, the second node columns of the diode structures are shown with the bit line label CL, and the word lines are shown with word line labels WL1 to WL6. In FIG. 15B, voltages are applied to the diode columns and the word lines. The first node column DL3 is biased at −2 V, and the remaining first node columns are biased at 0 V. The second node columns are biased at 0 V. The word line WL5 is biased at 10 V, and the remaining word lines are biased at 0 V. A band-to-band sensing operation is thereby performed on the gate diode memory cell at the intersection of word line WL5 and the first node column DL3. By measuring the current flowing through the first node column DL3 or the second node columns CL, the charge storage state of the charge storage structure of that gate diode memory cell is determined.

Figure 16A:
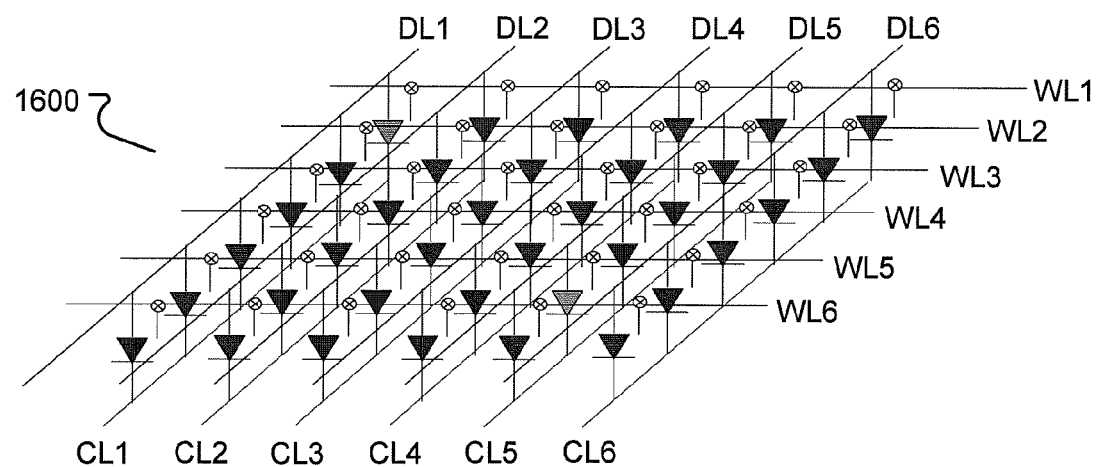
FIGS. 16A and 16B are simplified diagrams of an array of gated diode nonvolatile memory cells without interconnected second node columns, performing band-to-band sensing, where the doping arrangement of the diode structures is different from FIGS. 13A, 13B, 14A, and 14B.
Figure 16B:
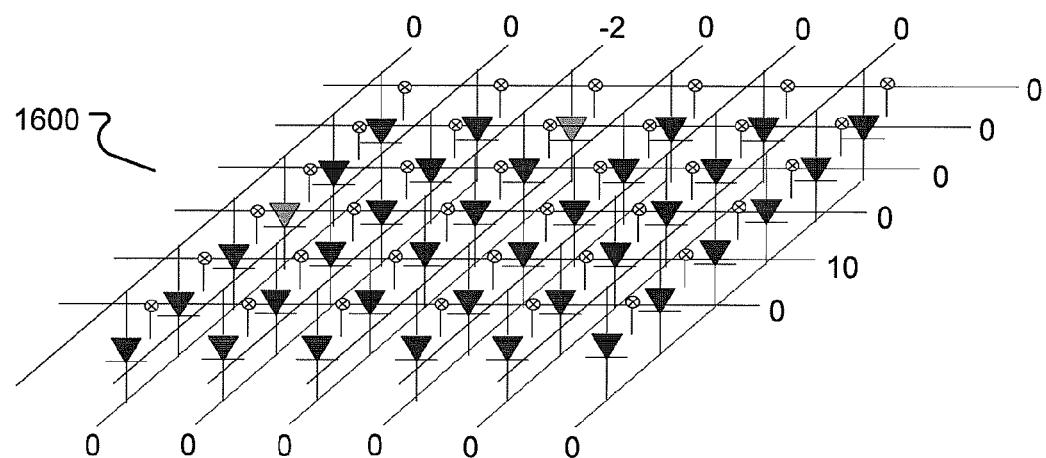

FIGS. 16A and 16B are simplified diagrams of an array of gated diode nonvolatile memory cells without interconnected node columns, performing band-to-band sensing, where the doping arrangement of the diode structures is like FIGS. 15A and 15B. Unlike the interconnected bit line structure of the second node columns shown in FIGS. 15A and 15B, in FIGS. 16A and 16B neighboring second node columns of the diode structures are treated as distinct bit lines. In FIG. 16A, the second node columns of the diode structures are shown with bit line labels CL1 to CL6. In FIG. 16B, voltages are applied to the diode columns and the word lines. The first node column DL3 is biased at −2 V, and the remaining first node columns are biased at 0 V. The second node columns are biased at 0 V. The word line WL5 is biased at 10 V, and the remaining word lines are biased at 0 V. A band-to-band sensing operation is thereby performed on the gate diode memory cell at the intersection of word line WL5 and the first node column DL3/second node column CL3. By measuring the current flowing through the first node column DL3 or second node column CL3, the charge storage state of the charge storage structure of that gate diode memory cell is determined.

FIGS. 17A and 17B are simplified diagrams of neighboring gated diode nonvolatile memory cells without interconnected second nodes, in which electron tunnel injection is performed as in FIG. 6A, but on selected cells. In FIG. 17A, the electron tunnel injection mechanism moves electrons from the gate structure 608 biased at −10 V to the charge storage structures 606 and 607. The first diode nodes 602 and 603 are biased at 10 V or are floating, and the second diode nodes 604 and 605 are biased at 10 V. In FIG. 17B, the first diode node 602 is biased at 10 V or is floating, but the first diode node 603 is biased at −10 V. The electron tunnel injection mechanism selectively moves electrons from the gate structure 608 biased at −10 V to the charge storage structure 606 but not to the charge storage structure 607. In other embodiments, the electron tunnel injection mechanism moves electrons from the first diode node to the charge storage structure as in FIG. 6B, but on selected cells. In other embodiments, the hole tunnel injection mechanism moves holes from the gate structure to the charge storage structure as in FIG. 8A, but on selected cells. In other embodiments, the hole tunnel injection mechanism moves holes from the first diode node to the charge storage structure as in FIG. 8B, but on selected cells.

Figure 18C:
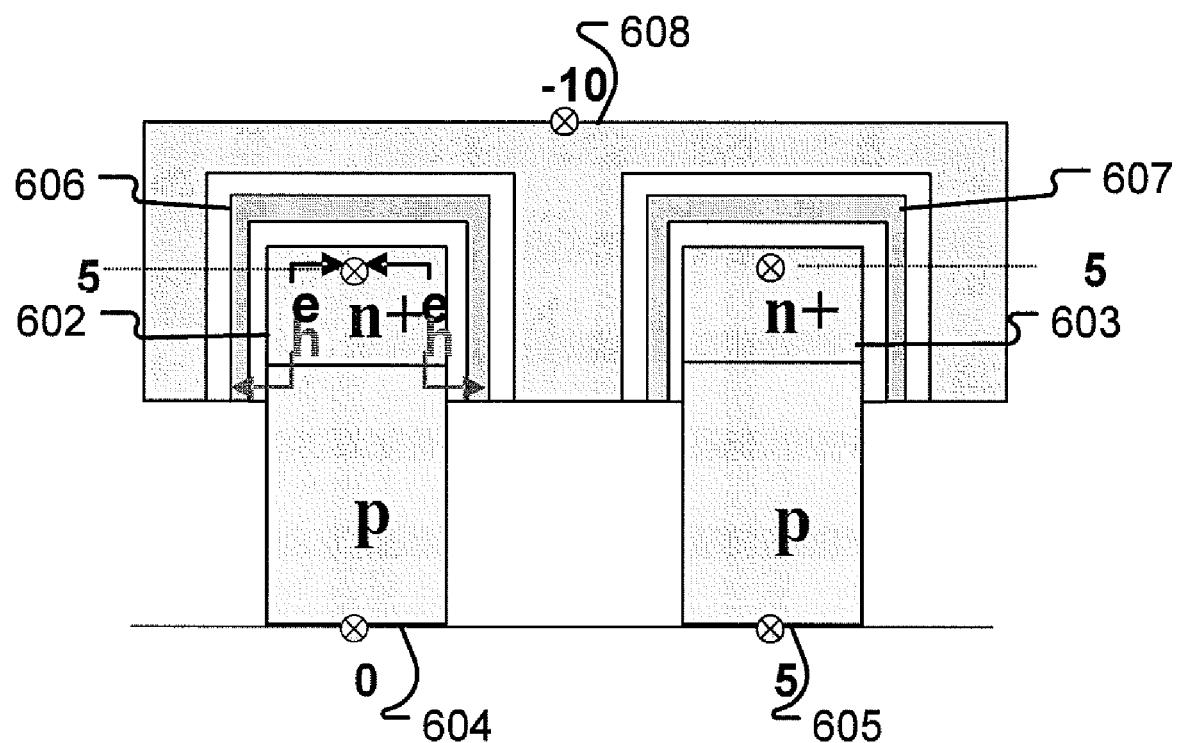

FIGS. 18A, 18B, and 18C are simplified diagrams of neighboring gated diode nonvolatile memory cells without interconnected second nodes, in which band-to-band hot hole injection is performed as in FIG. 9B, but on selected cells. In FIG. 18A, the band-to-band hot hole injection mechanism moves holes from the diode structure to the charge storage structure 606. The p-type second diode nodes 604 and 605 are biased at 0 V, the gate structure 608 is biased at −10 V, and electrons of the resulting electron-hole pairs flow into the n+-type first nodes 602 and 603 biased at 5 V. In FIG. 18B, the first diode node 602 is biased at 5 V, but the first diode node 603 is biased at 0 V. The band-to-band hot hole injection mechanism selectively moves holes from the diode structure to the charge storage structure 606 but not to the charge storage structure 607. FIG. 18C also shows band-to-band hot hole injection being performed selectively on the diode structure formed by the first diode node 602 and the second diode node 604, but not on the diode structure formed by the first diode node 603 and the second diode node 605, as in FIG. 18B. However, in FIG. 18C, the first diode node 603 is biased at 5 V and the second diode node 605 is biased at 5 V. Because a sufficient reverse bias is still absent in the diode structure formed by the first diode node 603 and the second diode node 605, the band-to-band hot hole injection mechanism is still absent in this diode structure. In other embodiments, the band-to-band hot electron injection mechanism selectively moves holes from the diode structure with a p-type first diode node and a n+-type second diode node to the charge storage structure as in FIG. 9A, but on selected cells. In other embodiments, the band-to-band hot electron injection mechanism selectively moves electrons from the diode structure with a p+-type first diode node and an n-type second diode node to the charge storage structure as in FIG. 7B, but on selected cells. In other embodiments, the band-to-band hot electron injection mechanism selectively moves electrons from the diode structure with an n-type first diode node and a p+-type second diode node to the charge storage structure as in FIG. 7A, but on selected cells.

Figures 22A, 22B:
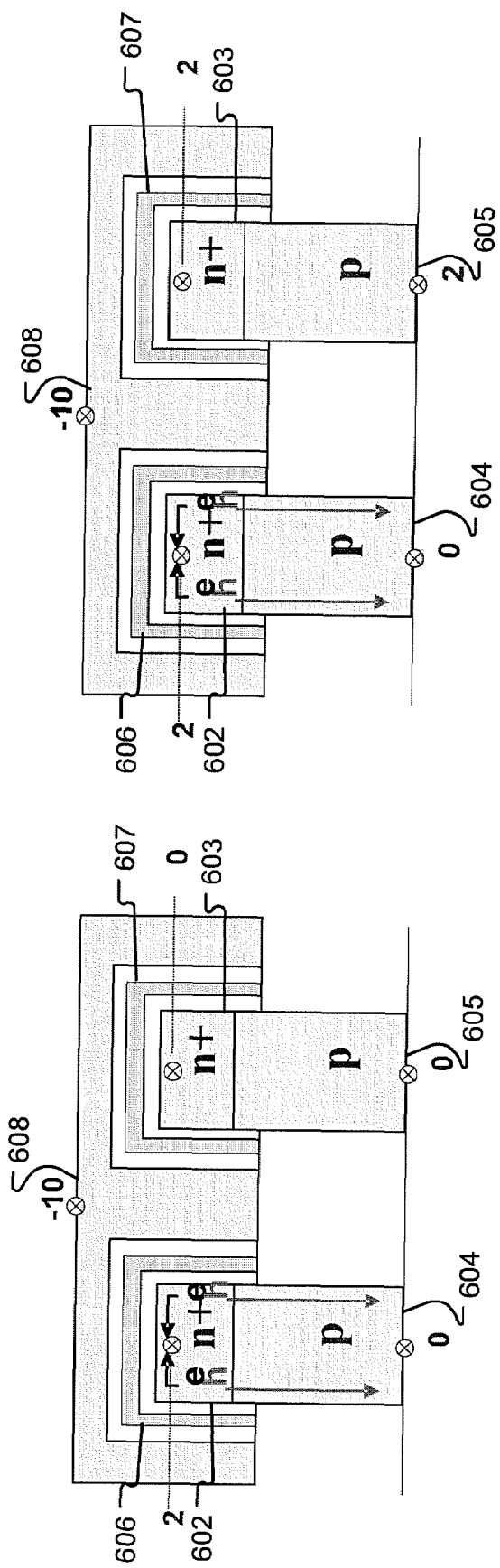
FIGS. 22A and 22B are simplified diagrams of neighboring gated diode nonvolatile memory cells without interconnected second nodes, in which band-to-band sensing is performed on selected cells.

FIGS. 22A and 22B are simplified diagrams of neighboring gated diode nonvolatile memory cells without interconnected second nodes, in which band-to-band sensing is performed as in FIGS. 10A and 10B, but on selected cells. In FIG. 22A, the band-to-band hot hole sensing mechanism creates electron-hole pairs in the diode structure formed by the n+-type first diode node 602 biased at 2 V and the p-type second diode node 604 biased at 0 V. Resulting electrons flow into the n+-type first diode node 602, and resulting holes flow into the p-type second diode node 604. This band-to-band sensing current indicates the amount of net positive or net negative charge characterizing the charge storage structure 606. The gate structure 608 is biased at −10 V. In the diode structure formed by the n+-type first diode node 603 biased at 0 V and the p-type second diode node 605 biased at 0 V, a band-to-band sensing current indicating the amount of charge characterizing the charge storage structure 607 does not flow, because a sufficient reverse bias is absent. FIG. 22B also shows band-to-band sensing being performed selectively on the diode structure formed by the first diode node 602 and the second diode node 604, but not on the diode structure formed by the first diode node 603 and the second diode node 605, as in FIG. 22A. However, in FIG. 22B, the first diode node 603 is biased at 2 V and the second diode node 605 is biased at 2 V. Because a sufficient reverse bias is still absent in the diode structure formed by the first diode node 603 and the second diode node 605, the band-to-band sensing mechanism is still absent. In other embodiments, the band-to-band sensing mechanism selectively flows in a diode structure with a p-type first diode node and a n+-type second diode node as in FIGS. 11A and 11B, but on selected cells.

Figure 19A:
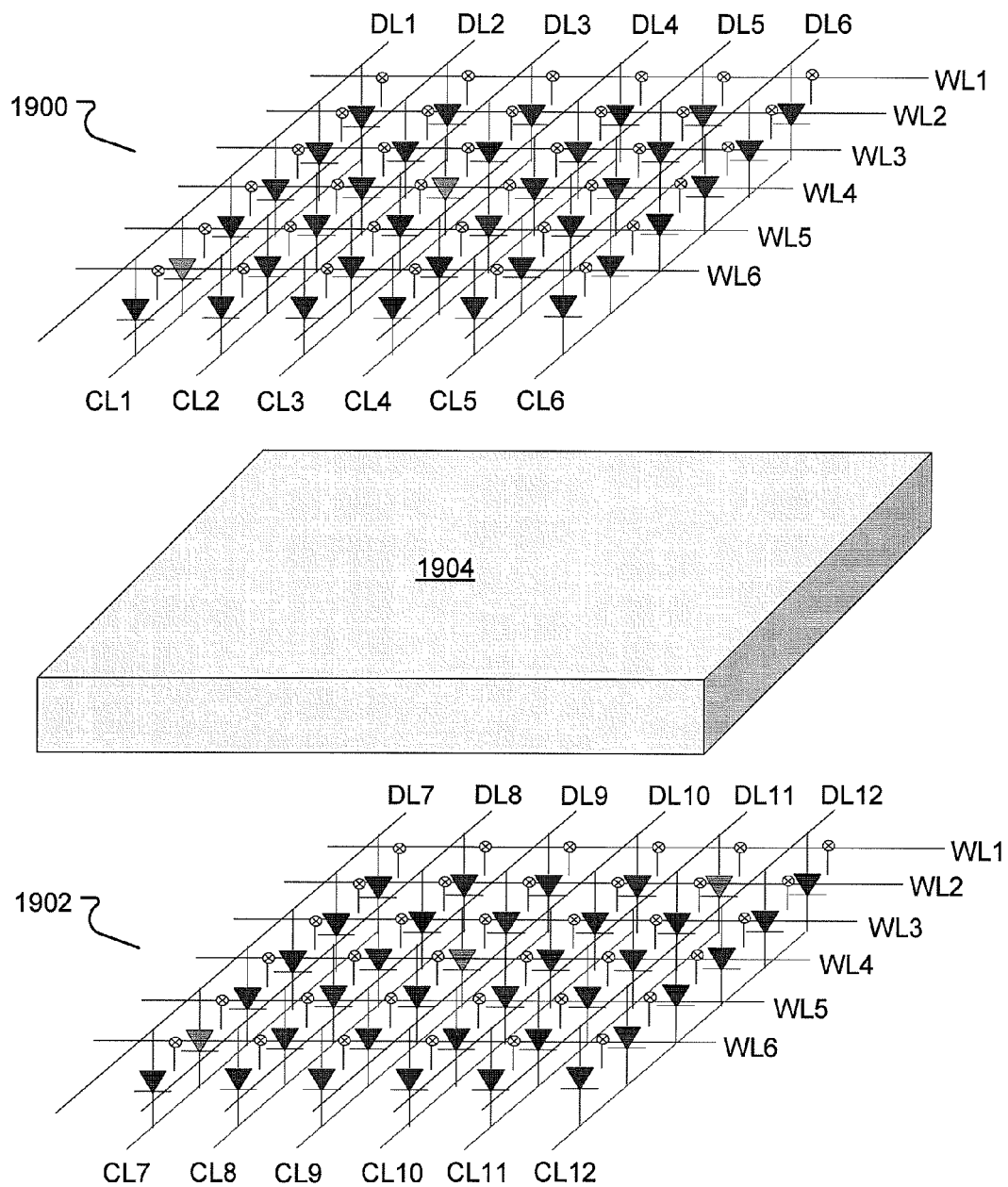
FIGS. 19A, 19B, and 19C are exploded view diagrams of multiple arrays of gated diode nonvolatile memory cells, with different interconnections of the word lines, first node columns, and second node columns, between different arrays.
Figure 19B:
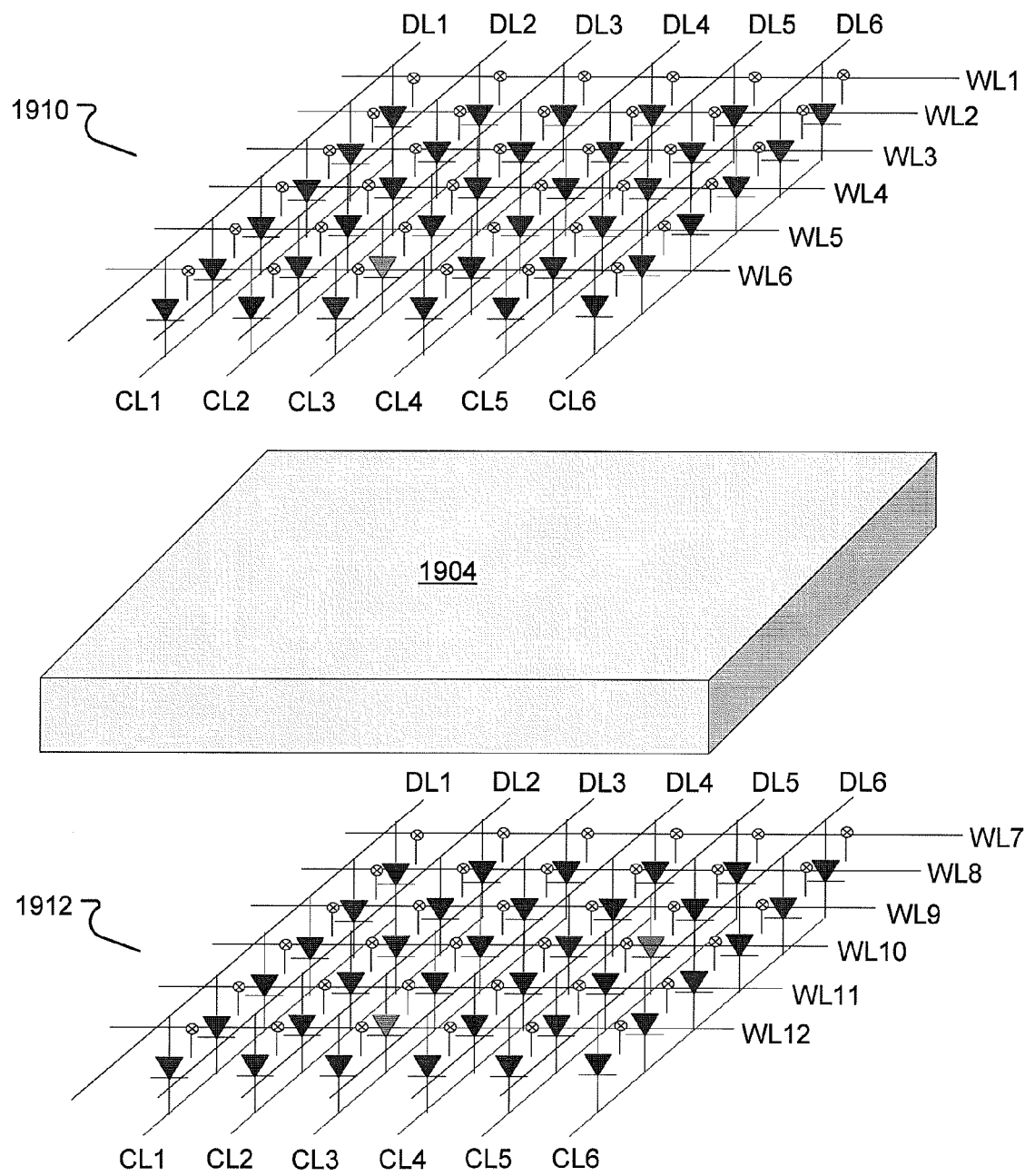
Figure 19C:
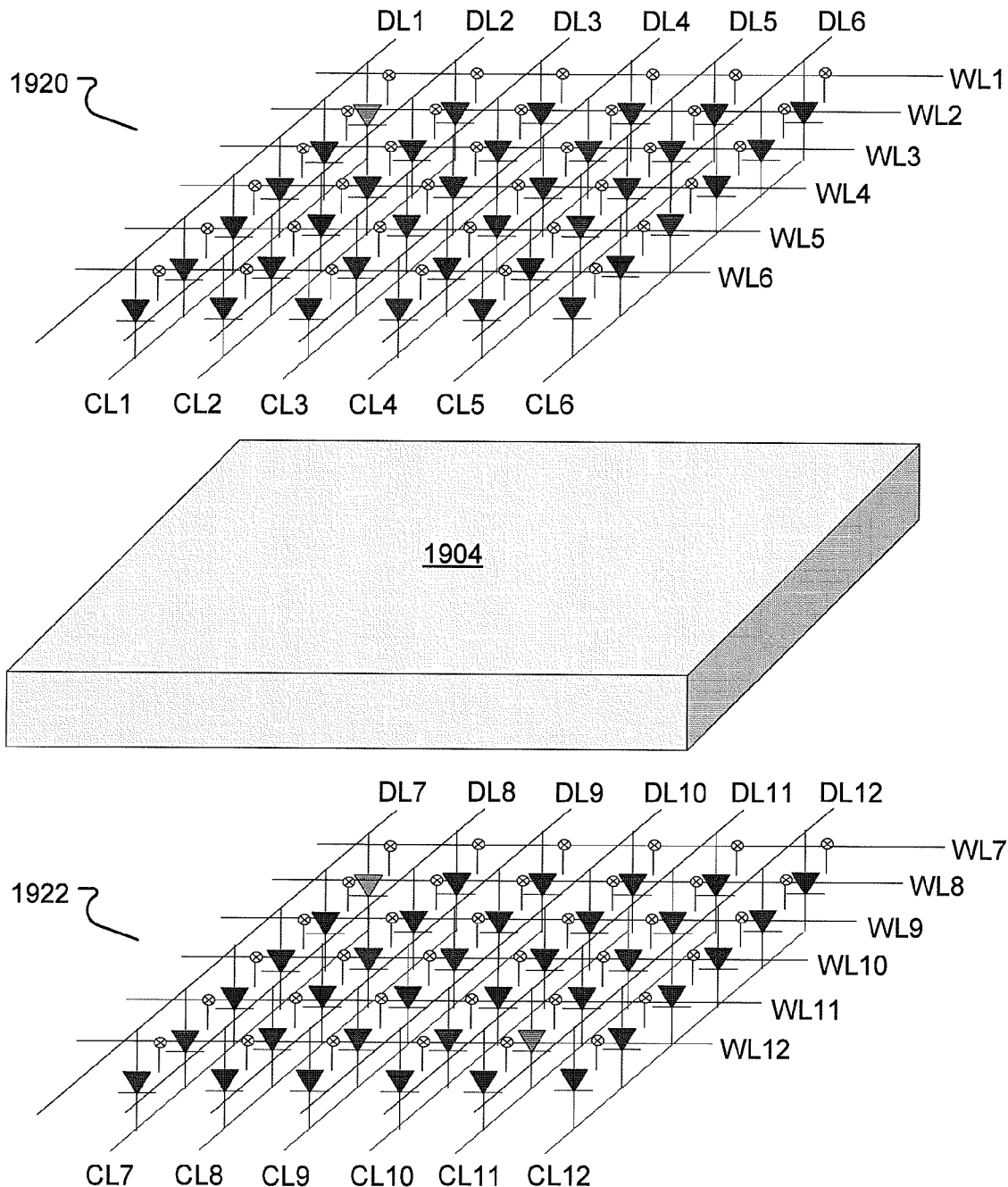

FIGS. 19A, 19B, and 19C are exploded view diagrams of multiple arrays of gated diode nonvolatile memory cells, with different interconnections of the word lines, first node columns, and second node columns, between different arrays. Each of the vertically displaced arrays is like the array shown in FIGS. 16A and 16B. Although the multiple arrays displaced vertically from one another by isolation oxide 1904 are part of the same integrated circuit, the multiple arrays are shown in exploded view to show the labels for all word lines and bit lines of the multiple arrays.

In FIG. 19A, the word lines of different arrays 1900 and 1902 are interconnected. The word lines of array 1900 and the word lines of array 1902 are both labeled WL1 to WL6. However, the first node columns and second node columns of different arrays are isolated from each other. The first node columns of array 1900 are labeled DL1 to DL6, and the first node columns of array 1902 are labeled DL7 to DL12. The second node columns of array 1900 are labeled CL1 to CL6, and the second node columns of array 1902 are labeled CL7 to CL12.

In FIG. 19B, the word lines of different arrays 1910 and 1912 are isolated from each other. The word lines of array 1910 are labeled WL1 to WL6, and the word lines of array 1912 are labeled WL7 to WL12. However, the first node columns and second node columns of the different arrays 1910 and 1912 are interconnected. The first node columns of array 1910 and array 1912 are both labeled DL1 to DL6, and the second node columns of array 1910 and array 1912 are both labeled CL1 to CL6.

In FIG. 19C, the word lines of different arrays 1920 and 1922, and the first node columns and second node columns of different arrays 1920 and 1922, are isolated from each other. The word lines of array 1920 are labeled WL1 to WL6, and the word lines of array 1922 are labeled WL7 to WL12. The first node columns of array 1920 are labeled DL1 to DL6, and the first node columns of array 1922 are labeled DL7 to DL12. The second node columns of array 1920 are labeled CL1 to CL6, and the second node columns of array 1922 are labeled CL7 to CL12.

In other embodiments, the multiple arrays have interconnected second node columns, such that a particular array of the multiple arrays has a common bit line structure for the second node columns of that array, or alternatively, for all of the arrays. In other embodiments, the first node columns are n-type and the second columns are p-type.

Figure 23:
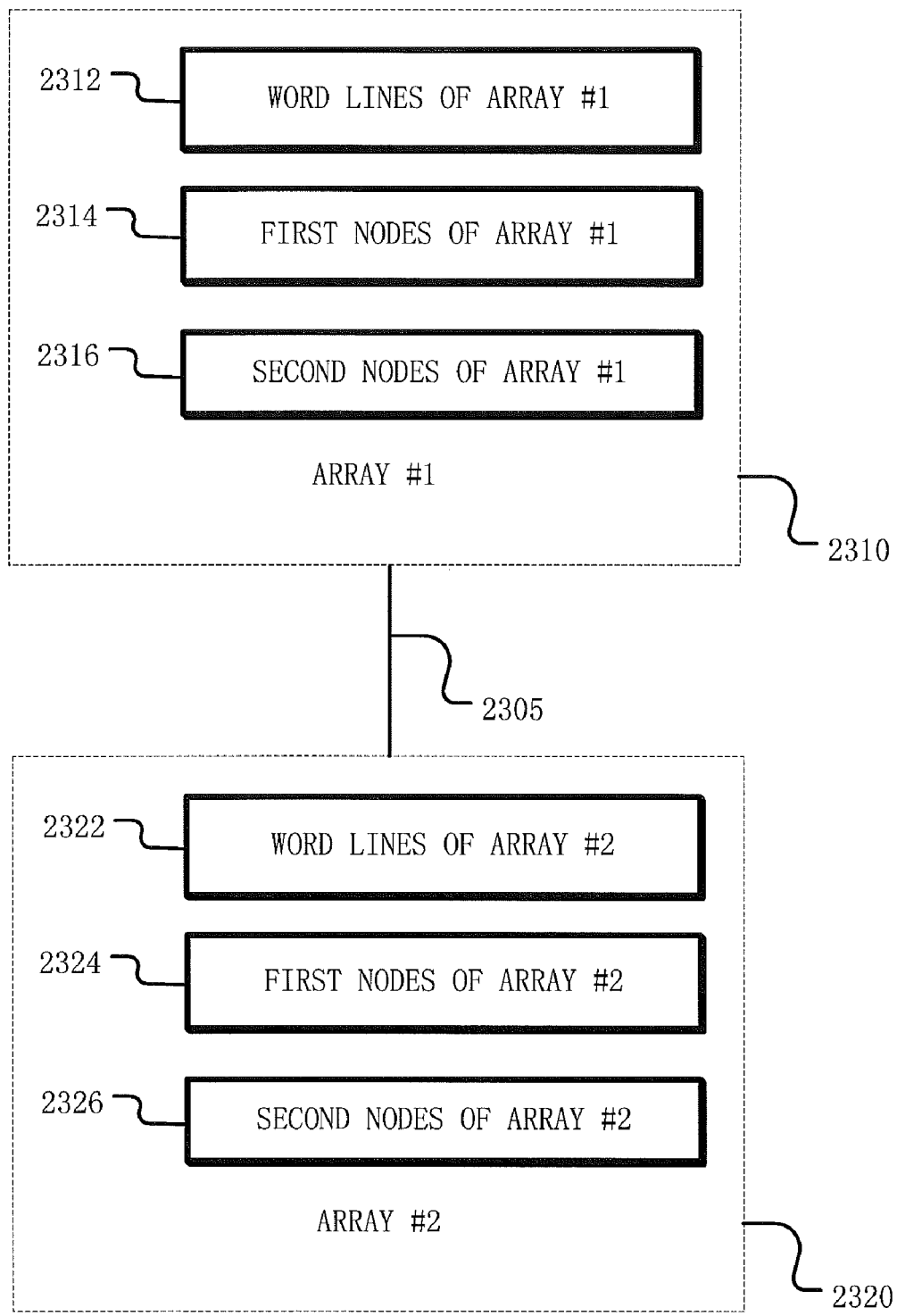
FIG. 23 is a block diagram showing interconnection between multiple arrays.

FIG. 23 is a block diagram showing interconnection between multiple arrays. Interconnection 2305 interconnects array #1 2310 and array #2 2320. Array #1 includes word lines 2312, first nodes 2314, and 2316. Array #2 includes word lines 2322, first nodes 2324, and 2326. Various particular interconnections are discussed above.

Figure 20:
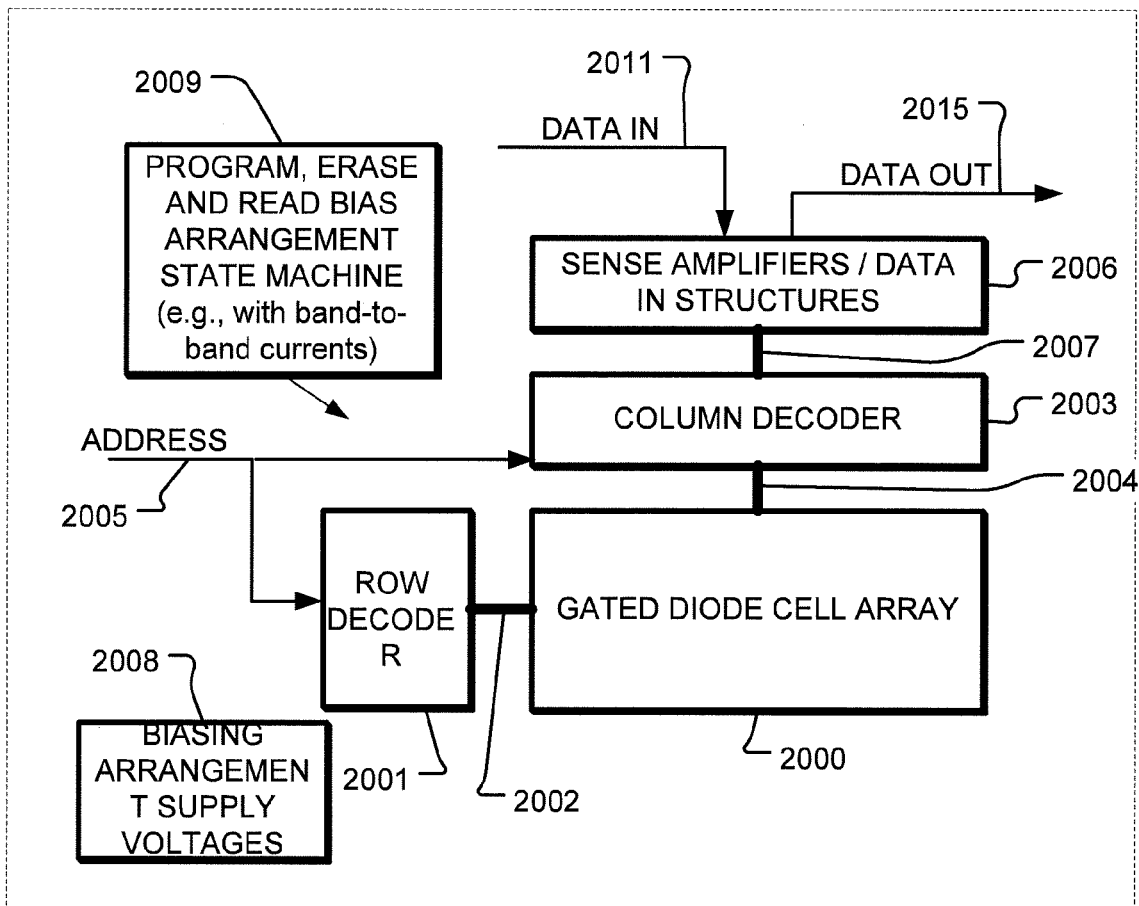
FIG. 20 is a simplified diagram of an integrated circuit with an array of gated diode nonvolatile memory cells and control circuitry.

FIG. 20 is a simplified diagram of an integrated circuit with an array of gated diode nonvolatile memory cells and control circuitry. The integrated circuit 2050 includes a memory array 2000 implemented using gate diode nonvolatile memory cells, on a semiconductor substrate. The gated diode memory cells of array 2000 may be individual cells, interconnected in arrays, or interconnected in multiple arrays. A row decoder 2001 is coupled to a plurality of word lines 2002 arranged along rows in the memory array 2000. A column decoder 2003 is coupled to a plurality of bit lines 2004 arranged along columns in the memory array 2000. Addresses are supplied on bus 2005 to column decoder 2003 and row decoder 2001. Sense amplifiers and data-in structures in block 2006 are coupled to the column decoder 2003 via data bus 2007. Data is supplied via the data-in line 2011 from input/output ports on the integrated circuit 2050, or from other data sources internal or external to the integrated circuit 2050, to the data-in structures in block 2006. Data is supplied via the data-out line 2015 from the sense amplifiers in block 2006 to input/output ports on the integrated circuit 2050, or to other data destinations internal or external to the integrated circuit 2050. A bias arrangement state machine 2009 controls the application of bias arrangement supply voltages 2008, such as for the erase verify and program verify voltages, and the arrangements for programming, erasing, and reading the memory cells, such as with the band-to-band currents.

FIGS. 21A-21H illustrate a sample process flow for multiple arrays of gated diode nonvolatile memory cells. FIG. 21A shows a structure with a p-type polysilicon layer 2112 on an oxide layer 2104 on a silicon substrate 2102. In FIG. 21B, sacrificial oxide 2116 is formed and nitride 2118 is formed. Shallow trench isolation is performed, resulting in multiple p-type polysilicon structures 2113. In FIG. 21C, the sacrificial oxide 2116 and nitride 2118 are removed. The multiple p-type polysilicon structures 2113 are implanted, resulting in p-type second nodes 2114 and n+-type first nodes 2121 of the gated diode nonvolatile memory cells. In FIG. 21D, the combined charge storage and dielectric structure 2123 and gate polysilicon 2132 are formed, completing the first array of gated diode nonvolatile memory cells. In FIG. 21E, another layer of oxide 2104 and another layer of p-type polysilicon 2112 are formed. In FIGS. 21F-21H, the steps of FIGS. 21B-D are substantially repeated to form another array of gated diode nonvolatile memory cells that is displaced vertically from the first array.

While the present invention is disclosed by reference to the technology and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A semiconductor device comprising:
   interlayer conductor connecting a plurality of arrays deposited in different layers;
   the plurality of arrays separated by insulating layers respectively, each of said arrays comprising:
   a plurality of conducting lines connecting to said interlayer conductor; and
   a plurality of cells arranged in rows and columns, each of said cells comprising:
   a junction device; and
   a charge storage element sandwiched by said junction device and one corresponding conducting line of said plurality of conducting lines,
   wherein a single said junction device and said corresponding conducting line are sufficient to provide biases reversibly altering said charge storage element among states and sensing said states.

2. The semiconductor device of claim 1, said charge storage element further comprising:
   a first insulator;
   a second insulator; and
   a charge-trapping layer between said first and second insulator.

3. The semiconductor device of claim 1, wherein said junction device is a diode.

4. The semiconductor device of claim 1, wherein said rows of different arrays are connected respectively.

5. The semiconductor device of claim 1, wherein said columns of different arrays are connected respectively.

6. An array comprising:
   a plurality of conducting lines, each connecting a row of a plurality of cells arranged in rows and columns;
   the plurality of cells arranged in rows and columns, each of said cells comprising:
   a junction device; and
   a charge storage element sandwiched by said junction device and a corresponding conducting line of said plurality of conducting lines,
   wherein a single said junction device and said corresponding conducting line are sufficient to provide biases reversibly altering said charge storage element among states and sensing said states.

7. The array of claim 6, wherein said charge storage element further comprises:
   a first insulator;
   a second insulator; and
   a charge trapping layer between said first and second insulators.

8. The array of claim 6, wherein said junction device is a diode.

9. A semiconductor device comprising:
   interlayer conductor connecting a plurality of arrays deposited in different layers;

the plurality of arrays separated by insulating layers respectively, each of said arrays comprising:
a plurality of wordlines;
a plurality of bitlines interlacing said wordlines; and
a plurality of cells deposited at intersections of said plurality of wordlines and plurality of bitlines, each of said cells comprising:
a junction device; and
a charge storage element embracing said junction device and sandwiched by said junction device and one corresponding wordline of said plurality of wordlines, wherein a single said junction device and said corresponding wordline are sufficient to provide biases reversibly altering said charge storage element among states and sensing said states.

10. The semiconductor device of claim 1, wherein said charge storage element further comprises:
a first insulator;
a second insulator; and
a charge trapping layer between said first and second insulator.

11. The semiconductor device of claim 9, wherein said junction device is a diode.

12. The semiconductor device of claim 9, wherein said plurality of wordlines of different arrays of the plurality of arrays are connected respectively.

13. The semiconductor device of claim 9, wherein said plurality of bitlines of different arrays of the plurality of arrays are connected respectively.

14. An array comprising:
a plurality of wordlines;
a plurality of bitlines interlacing said wordlines; and
a plurality of cells deposited at intersections of said plurality of wordlines and plurality of bitlines, wherein each of said cells comprises:
a junction device; and
a charge storage element embracing said juction device and sandwiched by said junction device and one corresponding wordline of said plurality of wordlines,
wherein a single said junction device and said corresponding wordline are sufficient to provide biases reversibly altering said charge storage element among states and sensing said states.

15. The array of claim 14, wherein said charge storage element further comprises:
a first insulator;
a second insulator; and
a charge-trapping layer between said first and second insulator.

16. The array of claim 14, wherein said junction device is a diode.

* * * * *